United States Patent
Zhu et al.

(10) Patent No.: US 12,557,460 B2
(45) Date of Patent: Feb. 17, 2026

(54) LIGHT-EMITTING DIODE AND LIGHT-EMITTING MODULE HAVING THE SAME

(71) Applicant: XIAMEN SAN'AN OPTOELECTRONICS CO., LTD., Xiamen (CN)

(72) Inventors: Xiushan Zhu, Xiamen (CN); Yan Li, Xiamen (CN)

(73) Assignee: XIAMEN SAN'AN OPTOELECTRONICS CO., LTD, Fujian (CN)

(*) Notice: Subject to any disclaimer, the term of this patent is extended or adjusted under 35 U.S.C. 154(b) by 640 days.

(21) Appl. No.: 17/931,690

(22) Filed: Sep. 13, 2022

(65) Prior Publication Data
US 2023/0077691 A1    Mar. 16, 2023

(30) Foreign Application Priority Data

Sep. 14, 2021 (CN) .......................... 202111076841.7
Sep. 14, 2021 (CN) .......................... 202111076849.3
Sep. 14, 2021 (CN) .......................... 202111076850.6

(51) Int. Cl.
*H10H 29/14* (2025.01)
*H10H 20/831* (2025.01)

(52) U.S. Cl.
CPC ...... *H10H 29/142* (2025.01); *H10H 20/8312* (2025.01)

(58) Field of Classification Search
CPC .......................... H10H 20/8312; H10H 29/142
See application file for complete search history.

(56) References Cited

U.S. PATENT DOCUMENTS

| | | | | |
|---|---|---|---|---|
| 2017/0317236 A1* | 11/2017 | Lee | ................... | H10H 20/8312 |
| 2018/0145224 A1* | 5/2018 | Kim | ................... | H10H 20/8512 |
| 2018/0309029 A1* | 10/2018 | Kim | ................... | H10H 20/821 |
| 2019/0229242 A1* | 7/2019 | Yoon | ................... | H10H 20/833 |
| 2019/0280176 A1* | 9/2019 | Lee | ................... | H10H 20/852 |
| 2020/0295229 A1* | 9/2020 | Kim | ................... | H10H 20/814 |

FOREIGN PATENT DOCUMENTS

| | | |
|---|---|---|
| CN | 107251240 A | 10/2017 |
| CN | 111063778 A | 4/2020 |
| TW | 200849666 A | 12/2008 |

OTHER PUBLICATIONS

Search Report appended to an Office Action, which was issued to Chinese counterpart application No. 202111076841.7 by the CNIPA on Jun. 16, 2022 with an English translation thereof.

* cited by examiner

*Primary Examiner* — Fernando L Toledo
*Assistant Examiner* — Ryan T. Fortin
(74) *Attorney, Agent, or Firm* — MUNCY, GEISSLER, OLDS & LOWE, P.C.

(57) ABSTRACT

A light emitting device includes a semiconductor structure and an insulating layer. The semiconductor structure has a mesa recess extending from a top surface of a second semiconductor layer to a top surface of a first semiconductor layer. The insulating layer covers the semiconductor structure and has an electrode passage hole on the top surface of the first semiconductor at the bottom of the mesa recess. The second semiconductor layer has a top boundary edge intersecting the boundary wall of the mesa recess above the electrode passage hole. A minimum distance from the electrode passage hole to the top boundary edge of the second semiconductor layer is no less than 1 μm.

16 Claims, 24 Drawing Sheets

LIGHT-EMITTING DIODE AND LIGHT-EMITTING MODULE HAVING THE SAME

CROSS-REFERENCE TO RELATED APPLICATION

This application claims priority to Chinese Invention Patent Application No. 202111076841.7, Chinese Invention Patent Application No. 202111076849.3, and Chinese invention Patent Application No. 202111076850.6, filed on Sep. 14, 2021.

FIELD

The disclosure relates to a light-emitting device, and a light-emitting module using the light-emitting device.

BACKGROUND

A conventional light-emitting diode (LED) includes different materials and is a type of solid state lighting component. LEDs have good photoelectric properties as well as the advantages low cost, high efficiency, high luminous efficacy, small size, and are environmentally friendly. Therefore, LEDs have been widely employed in a variety of fields such as lighting, visible light communication, and optical displays.

SUMMARY

Therefore, an object of the disclosure is to provide a light-emitting device with high reliability.

According to one aspect of the disclosure, the light emitting device includes a semiconductor structure and an insulating layer. The semiconductor structure has a first semiconductor layer, an active layer, and a second semiconductor layer that are stacked sequentially. The semiconductor structure has at least one mesa recess that is formed with a mesa recess boundary wall that extends from a top surface of the second semiconductor layer to a top surface of the first semiconductor layer to expose the top surface of the first semiconductor layer at a bottom of the mesa recess, and that is located at an inside region (E) of the semiconductor structure and/or a border region (M) of the semiconductor structure. The insulating layer covers at least side walls of the semiconductor structure in the border region (M) of the semiconductor structure, the mesa recess boundary wall, and the top surface of the first semiconductor layer at the bottom of the mesa recess. The insulating layer has at least one electrode passage hole formed on the top surface of the first semiconductor layer at the bottom of the mesa recess. The at least one electrode passage hole has a bottom end that meets the top surface of the first semiconductor layer at the bottom of the mesa recess. The top surface of the second semiconductor layer has a hole boundary edge intersecting the mesa recess boundary wall above the at least one electrode passage hole, a minimum distance measured along a horizontal direction perpendicular to a stacking direction of the semiconductor structure from the bottom end of the at least one electrode passage hole to the top boundary edge of the second semiconductor layer is no less than 1 μm.

According to another aspect of the disclosure, a light-emitting module is provided with the above mentioned light-emitting device.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
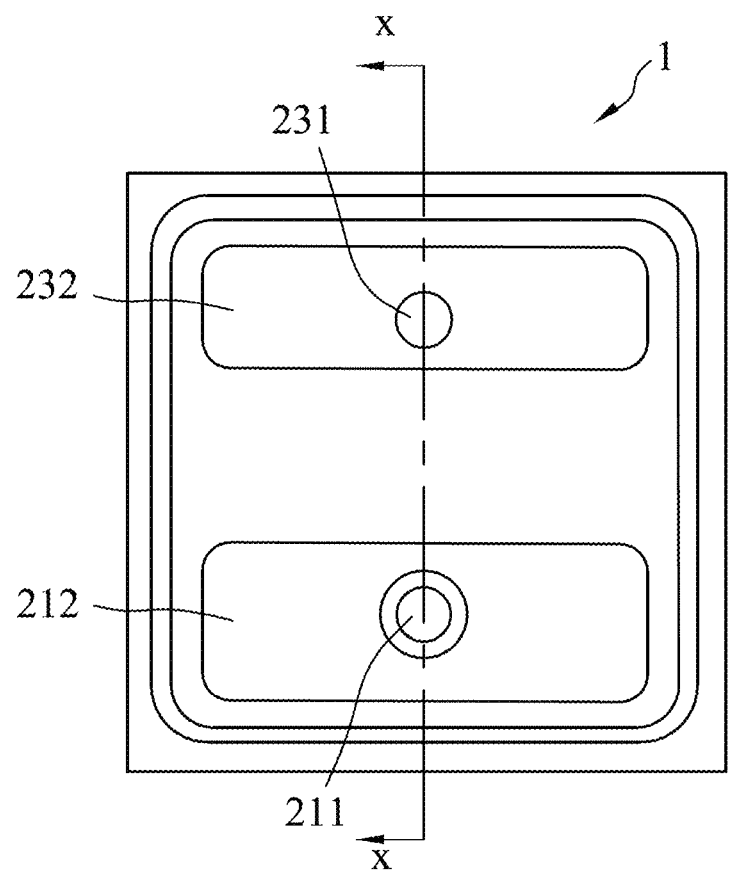
FIG. 1 is a schematic top view illustrating a first embodiment of a light-emitting device according to the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
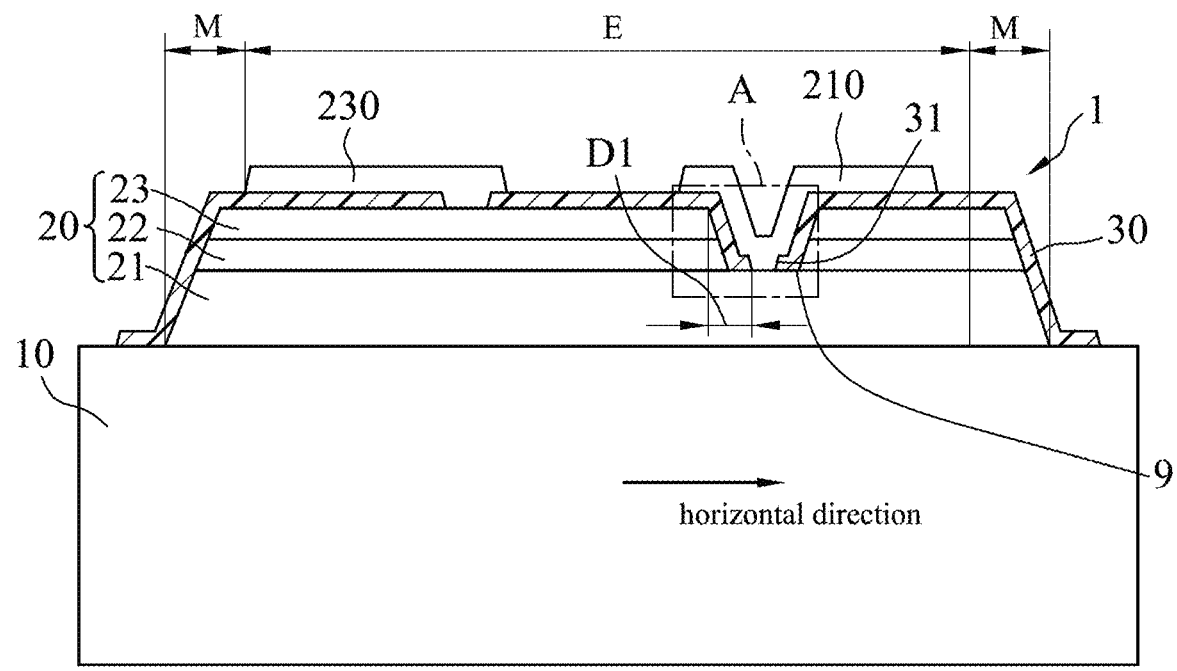
FIG. 2 is a schematic cross-sectional view taken along line X-X in FIG. 1.

Referring to FIGS. 1 and 2, a first embodiment of the light-emitting device 1 according to the present disclosure is shown, and includes a substrate 10, an semiconductor structure 20, and an insulating layer 30. The semiconductor structure 20 has a first semiconductor layer 21, an active layer 22, and a second semiconductor layer 23 that are stacked sequentially. The insulating layer 30 is located above the second semiconductor layer 23.

The substrate 10 may be an insulating substrate, and may be made of a transparent material, a semi-transparent material, or an opaque material. In this embodiment, the substrate 10 is a sapphire ($Al_2O_3$) substrate. In other embodiments, the substrate 10 may be made of a conductive material, or a semiconductor material. For example, the substrate 10 may be one of a silicon carbide (SiC) substrate, a silicon (Si) substrate, a spinel ($MgAl_2O_4$) substrate, a magnesium oxide (MgO) substrate, a lithium aluminate ($LiAlO_2$) substrate, and a lithium gallate ($LiGaO_2$) substrate. In some embodiments, the substrate 10 may be thinned or removed to form a thin film LED chip.

In some embodiments, a patterned structure (not shown) is formed on a top surface of the substrate 10 to increase light extraction efficiency. The patterned structure formed on the substrate 10 may be polygonal structures, semi-spherical structures, or conical structures. For example, frustums, cones, tetrahedrons, hexagonal pyramids, assorted conical structures, assorted tetrahedral structures, or assorted hexagonal pyramidal structures. Additionally, the patterned structure may be selectively formed on different areas of the top surface of the substrate 10. In some embodiments, the patterned structure may be the same material as the substrate 10, or in some other embodiments, it may be advantageous for the patterned structure to be made of a material that is different from the substrate 10. For example, the patterned substrate may be made of a material with a lower refractive index than the substrate 10 for better light extraction, such as $SiO_2$.

The semiconductor structure 20 is formed on the top surface of the substrate 10, where the first semiconductor layer 21, the active layer 22 and the second semiconductor layer 23 of the semiconductor structure 20 are sequentially grown and stacked on top of each other. In some embodiments, the semiconductor structure 20 may be formed over the substrate 10 via a bonding layer (not shown) that is preferably made of a transparent material.

The semiconductor structure 20 may be configured to emit light of a particular wavelength, such as light with a wavelength in the ultra violet, purple, blue, green or red band of the electromagnetic spectrum. In this embodiment, the semiconductor structure 20 is configured to emit a blue light, and the first semiconductor layer 21 is an N-type semiconductor layer that supplies electrons to the active layer 22. The active layer 22 may be a single quantum well structure or a multi quantum well structure. In preferred embodiments, the active layer 22 is a multi quantum well structure that may be a gallium nitride (GaN) and aluminum gallium nitride (AlGaN) alternating stack, an indium gallium aluminum nitride (InAlGaN) alternating stack, an Indium gallium nitride (InGaN) and aluminum gallium nitride (AlGaN) alternating stack, or an indium gallium nitride (InGaN) and gallium nitride (GaN) alternating stack. The light emitting efficiency of the active layer 22 may be increased by adjusting the depth of the quantum well(s), controlling the thickness, controlling the number of well and barrier pairings, or adjusting other variables. In this embodiment, the second semiconductor layer 23 is a P-type semiconductor layer which supplies electron holes to the active layer 22. The second semiconductor layer 23 may be a single layer structure or a multi-layer structure. In the case where the second semiconductor layer 23 is multi-layered, it may have different compositions.

It should be noted that, the structure of the semiconductor structure 20 is not limited to that disclosed and may have different compositions based on different practical requirements. For example, in some embodiments of the light-emitting device 1, there may be a buffer layer (not shown) disposed between the substrate 10 and the semiconductor structure 20 to reduce lattice mismatch between the substrate 10 and the first semiconductor layer 21. In other embodiments, the buffer layer may be a single layer or multi-layered, and may include an unintentionally doped gallium nitride (GaN) layer or an unintentionally doped aluminum gallium nitride (AlGaN) layer. In still other embodiments, the substrate 10 is a patterned substrate and the buffer layer may include an aluminum nitride (AlN) buffer layer made by sputter deposition that is formed on top of the substrate 10.

Figure 3:
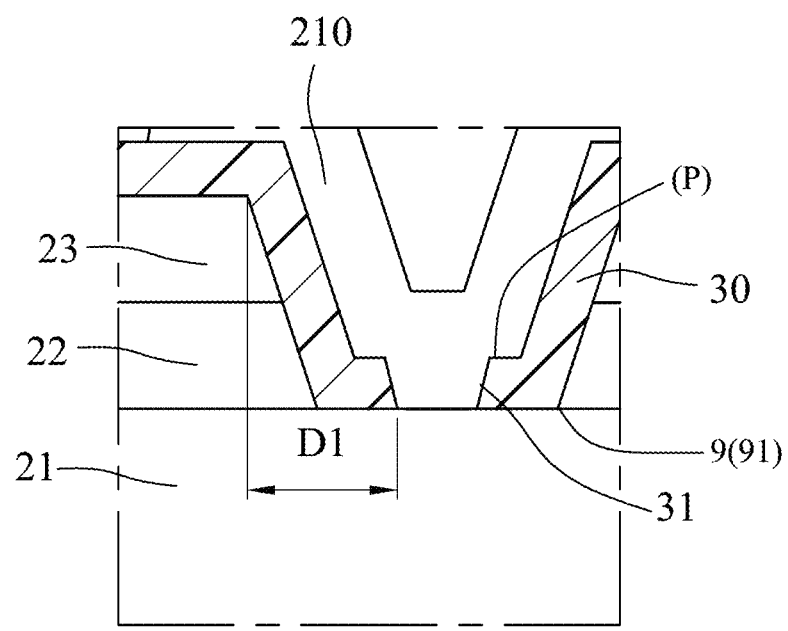
FIG. 3 is an enlarged schematic cross-sectional view of an A-area shown in FIG. 2.
Figure 8:
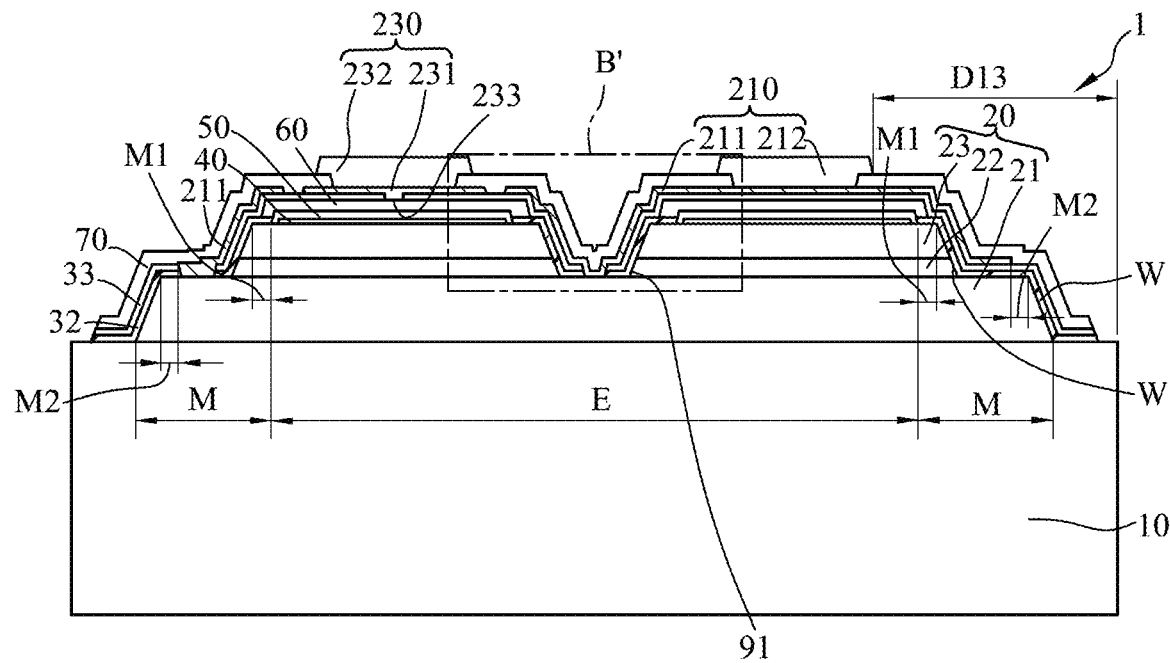
FIG. 8 is a schematic cross-sectional view taken along line Z-Z in FIG. 5.

Referring back to FIGS. 1 to 3, the semiconductor structure 20 has one mesa recess 9 that is formed with a mesa recess boundary wall 91. The mesa recess 9 is formed by removal of a portion of the second semiconductor layer 23 and the active layer 22, and extends from a top surface of the second semiconductor layer 23 to a top surface of the first semiconductor layer 21 to exposes a portion of the top surface of the first semiconductor layer 21 at a bottom of the mesa recess 9. The mesa recess 9 may permit the installation of mesa-electrodes. The mesa recess 9 may be located at an inside region (E) of the semiconductor structure 20, and/or a border region (M) of the semiconductor structure 20. The border region (M) of the semiconductor structure 20 is shown in more detail in FIG. 8. As shown in FIG. 8, the border region (M) of the semiconductor structure 20 includes a top surface peripheral area (M1) of the second semiconductor layer 23, a top surface peripheral area (M2) of the first semiconductor layer 21, side walls (W) extending from the top surface peripheral area (M1) to the top surface peripheral area (M2), and side walls (W) extending downward from the top surface peripheral area (M2) to the bottom end of the first semiconductor layer 21.

In some embodiments, the semiconductor structure 20 has a plurality of mesa recesses 9, and a total cross sectional area of the mesa recesses 9 are collectively less than a total surface area of the top surface of the first semiconductor layer 21. The mesa recesses 9 expose the top surface of the first semiconductor layer 21 so as to form an electrical connection between the first semiconductor layer 21 and electrodes of the light-emitting device 1. Additionally, on areas of the semiconductor structure 20 that have the mesa recesses 9, an inclined angle between a side wall and the top surface of the first semiconductor layer 21 may be formed.

Referring back to FIGS. 1 to 3, the insulating layer 30 is located on top of the second semiconductor layer 23 of the semiconductor structure 20, and covers at least side walls of the semiconductor structure 20 in the border region (M) of the semiconductor structure 20, the mesa recess boundary wall 91 and the top surface of the first semiconductor layer 21 at the bottom of the mesa recess 9. In this embodiment, the insulating layer 30 has one electrode passage hole 31 formed on the top surface of the first semiconductor layer at the bottom of the mesa recess 9. It should be noted that the insulating layer 30 may have multiple electrode passage holes 31 according to practical requirements. The top surface of the first semiconductor layer 21 is exposed through the insulating layer 30 via the electrode passage hole 31 so that an electrical connection may be made on the first semiconductor layer 21. More specifically, the electrode passage hole 31 has a bottom end that meets the top surface of the first semiconductor layer 21 and that exposes a portion of the top surface of the first semiconductor layer 21 at the bottom of the mesa recess 9. The top surface of the second semiconductor layer 23 has a top boundary edge intersecting the mesa recess boundary wall 91, above the electrode passage hole 31. A minimum distance (D1) measured along a horizontal direction perpendicular to a stacking direction of the semiconductor structure 20 from the bottom open end of the electrode passage hole 31 to the top boundary edge of the second semiconductor layer 23 is no less than 1 µm. The light-emitting device 1 according to the present disclosure is designed with the minimum distance (D1) to have better electrical insulation and to prevent leakage.

In some embodiments, the minimum distance (D1) may be no less than 1 µm and no greater than 12 µm. In other embodiments, the minimum distance (D1) may be greater than 2 µm. It should be noted that, in general, the thickness of the insulating layer 30 at the side walls of the semiconductor structure 20 are relatively thinner. In this embodiment, after an etching process is performed on the insulating layer 30, the insulating layer 30 on the mesa recess boundary wall 91 has a raised film platform (P) that covers and contacts the portion of the top surface of the first semiconductor layer 21 at the bottom of the mesa recess 9. The raised film platform (P) bounds the electrode passage hole 31 and has a relatively large thickness around the electrode passage hole 31. By having the minimum distance (D1), sufficient thickness of the insulating layer 30 may be retained after etching in a region between the electrode passage hole 31 near the top surface of the first semiconductor layer 21 and the mesa recess boundary wall 91, which allows the insulating layer 30 to have sufficient insulating effect over the semiconductor structure 20. The sufficient insulation enhances electrical insulation, moisture resistance, and leakage protection. If no such raised film platform of the insulating layer 30 remained on the top surface of the first semiconductor layer 21 after etching, because the insulating layer 30 formed by deposition at the mesa recess boundary wall 91 is generally thin, and because a lateral etching that occurs during a buffered oxide etch (BOE) process may further reduce the thickness of the insulating layer 30 on the mesa recess boundary wall 91, the thickness of the insulating layer 30 on the mesa recess boundary wall 91 will be noticeably reduced. The relatively thin insulating layer 30 may cause a metal layer subsequently formed above the insulating layer 30 to be uneven. This may increase the risk of chip leakage and package leakage, and decrease moisture protection.

The light-emitting device 1 further includes a first electrode 210 and a second electrode 230 disposed on a top surface of the insulating layer 30. In the first embodiment, the first electrode 210 is an N-type electrode, and the second electrode is a P-type electrode. A minimum distance between the first electrode 210 and the second electrode 230 ensures there is enough separation between the N-type and the P-type electrodes of the light-emitting device 1. The first electrode 210 fills the one electrode passage hole 31 and is electrically connected with the first semiconductor layer 21 via the electrode passage hole 31. The second electrode 230 is electrically connected to the second semiconductor layer 23.

Generally, in light-emitting devices, the size of the contact area between the N-type electrode (the first electrode 210 in this embodiment) and the N-type semiconductor layer (the first semiconductor layer 21 in this embodiment) will affect its photoelectric properties, and hence, affect the voltages of the LED 1. When designing the light-emitting device 1, the N-type electrode contact area should have a size that is configured to complement the desired magnitude of the driving current density. It should be noted, that the N-type electrode contact area is substantially equal to the cross-sectional area of the electrode passage hole 31, and since the photoelectric properties of the light-emitting device 1 are dependent on the size and not the shape of the electrode passage 31, the number of electrode passage holes 31 and the size of the electrode passage holes 31 may be adjusted to achieve specific purposes or meet specific requirements. Therefore, the electrode passage hole 31 may be formed in any one of regular shapes, for example, a circular shape, or a rectangular shape. In this embodiment, the electrode passage hole 31 is circular, and since the electrode passage hole 31 passes through the insulating layer 30 to expose the top surface of the first semiconductor layer 21, the electrode passage hole 31 is a through hole with a diameter greater than 8 μm. If the diameter of the electrode passage hole 31 is too small, a current crowding effect is more likely to occur and the drive voltage of the light-emitting device 1 may be increased. In some embodiments, the insulating layer 30 may have a plurality of electrode passage holes 31 that each has a diameter of 12 μm. In other embodiments, the insulating layer 30 has a plurality of electrode passage holes 31 and collectively a total cross sectional area of the electrode passage holes 31 is no smaller than 0.2% and no greater than 30% of the total top surface area of the semiconductor structure 20. In this case, the N-electrode (the first electrode 210) and the N-type semiconductor layer (the first semiconductor layer 21) will have a contact area (i.e., the cross-sectional area of the electrode passage hole 31) with a well formulated size to decrease drive voltage, and improve the photoelectric properties of the light-emitting device 1.

In preferred embodiments, the insulating layer 30 is a reflective insulating layer, is located above the second semiconductor layer 23 of the semiconductor structure 20, and is covering the side walls of the semiconductor structure 20. In this embodiment, the light emitted by the semiconductor structure 20 exits from the side of the substrate 10, and the insulating layer 30 is a reflective insulating layer that is used to reflect light and isolate the first and second electrodes 210, 230.

Figure 4:
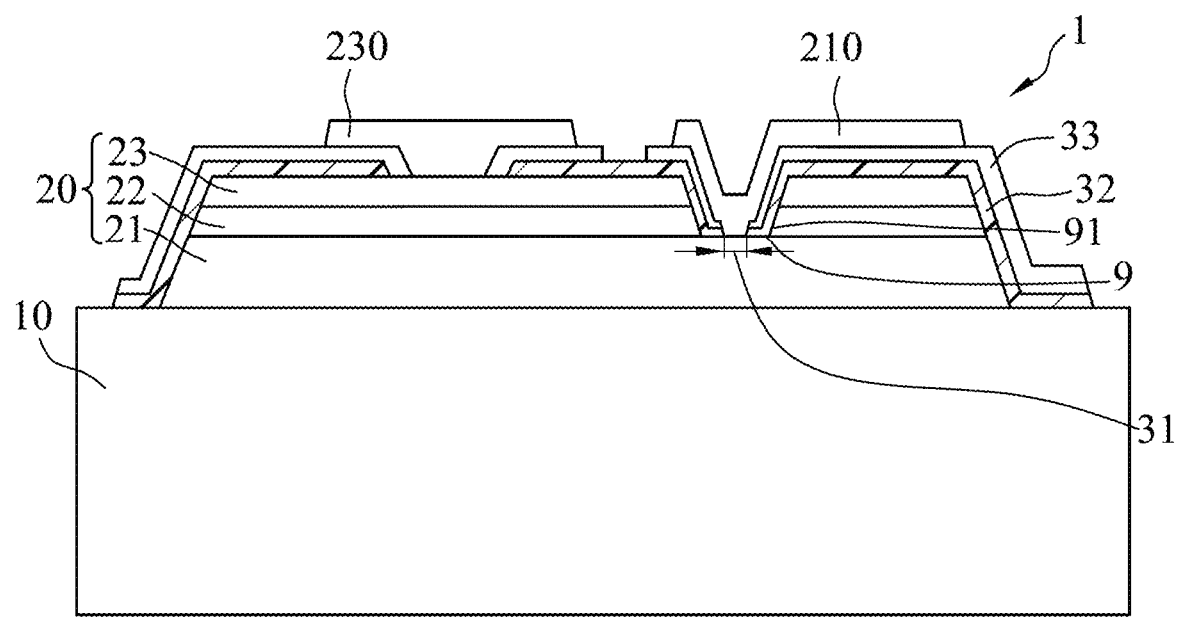
FIG. 4 is a schematic cross-sectional view of a variation of the first embodiment.

Referring to FIG. 4, in a variation of the first embodiment, the insulating layer 30 includes a first insulating layer 32 and a second insulating layer 33 that are sequentially stacked on top of the second semiconductor layer 23. The first insulating layer 32 is located above the second semiconductor layer 23 of the semiconductor structure 20 and covering the side walls of the semiconductor structure 20 and the mesa recess boundary wall 91. The first insulating layer 32 may include a material such as silicon dioxide ($SiO_2$), silicon nitride (SiN), silicon oxynitride ($SiO_xN_y$), titanium dioxide ($TiO_2$), silicon nitride ($Si_3N_4$), aluminum oxide ($Al_2O_3$), titanium nitride (TiN), aluminum nitride (AlN), zirconium dioxide ($ZrO_2$), titanium aluminum nitride (TiAlN), titanium silicon nitride (TiSiN), hafnium(IV) oxide ($HfO_2$), tantalum oxide ($TaO_2$), or magnesium fluoride ($MgF_2$). The first insulating layer 32 may be made by a plasma-enhanced chemical vapor deposition (PECVD) process, an atomic layer deposition (ALD) process, or other suitable processes. In some embodiments, the first insulating layer 32 may include a material such as aluminum oxide ($Al_2O_3$) or silicon dioxide ($SiO_2$). The second insulating layer 33 is located above the first insulating layer 32, and covers a top surface and side walls of the first insulating layer 32. The second insulating layer 33 may include a material such as silicon dioxide ($SiO_2$), silicon nitride (SiN), silicon oxynitride (SiOxNy), titanium dioxide ($TiO_2$), silicon nitride ($Si_3N_4$), aluminum oxide ($Al_2O_3$), titanium nitride (TiN), aluminum nitride (AlN), zirconium dioxide ($ZrO_2$), titanium aluminum nitride (TiAlN), titanium silicon nitride (TiSiN), hafnium(IV) oxide ($HfO_2$), tantalum oxide ($TaO_2$), or magnesium fluoride ($MgF_2$). The electrode passage hole 31 passes through the first insulating layer 32 and the second insulating layer 33 to reach the first semiconductor layer 21. For the purpose of providing decent insulating protection and leakage protection, in some embodiments, the thickness of the first insulating layer 32 is between 30 nm and 150 nm. Additionally, a total thickness of the first insulating layer 32 and the second insulating layer 33 on the side walls of the semiconductor structure 20 is no less than 800 nm.

In some embodiments, the first insulating layer 32 has a refractive index that is greater than 1.4 and may be made of silicon dioxide ($SiO_2$), silicon nitride (SiN), aluminum oxide ($AL_2O_3$), or any combinations thereof. The first insulating layer 32 has a thickness that is between 30 nm and 150 nm. The second insulating layer 33 is an insulating reflective layer that may be made from multiple dielectric films formed into a multilayered film structure with alternating layers of high refractive index and low refractive index dielectric films. For example the high refractive index films may be made of titanium dioxide ($TiO_2$), niobium pentoxide ($Nb_2O_5$), tantalum pentoxide ($Ta_2O_5$), hafnium (IV) oxide ($HfO_2$), zirconium dioxide ($ZrO_2$), etc.; while the low refractive index films may be made of silicon dioxide ($SiO_2$), magnesium fluoride ($MgF_2$), aluminum pentoxide ($Al_2O_5$), silicon oxynitride (SiON) etc. With this design (alternating high and low refractive index multilayered film design), the second insulating layer 33 may have superior reflective performance and enhanced photoelectric properties.

The second insulating layer 33 should have good insulating properties to ensure adequate insulation is achieved between different conductive materials in the light-emitting device 1. The second insulating layer 32 may be a single layer structure or a multilayered structure, with a thickness between 500 nm and 1500 nm. In some embodiments, the second insulating layer 33 may be a redistributed Bragg reflector (DBR) with a thickness between 1000 nm and 5000 nm.

Figure 5:
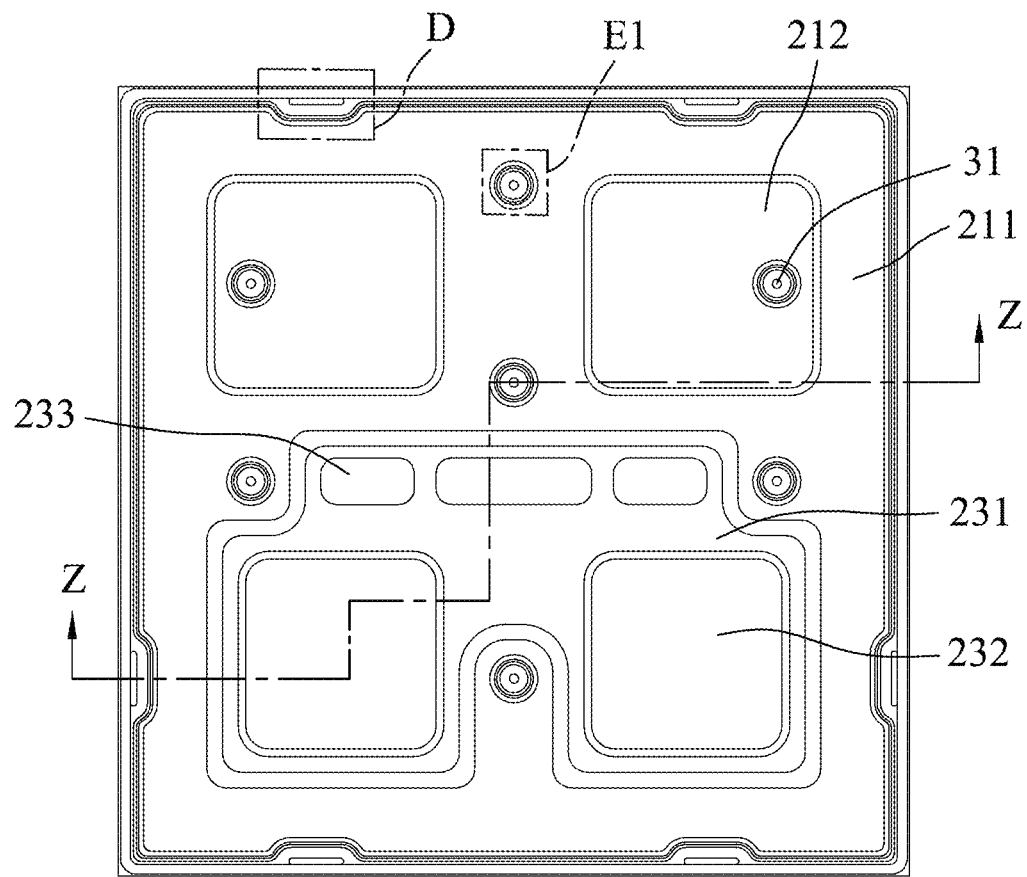
FIG. 5 is a schematic top view illustrating a second embodiment of the light-emitting device according to the present disclosure.

Referring to FIGS. 5 and 8, where a second embodiment of the light-emitting device 1 is shown. The second embodiment differs from the variation of the first embodiment shown in FIG. 4 in that it includes a transparent conductive layer 40, a reflective electrode layer 50, an electrode coating layer 60, a third insulating layer 70, a first connecting electrode 211, one or more first-electrode pads 212, and one or more second-electrode pads 232. The transparent conductive layer 40 is located above the second semiconductor layer 23. Additionally, in the second embodiment, the first insulating layer 32 at least covers the border region (M) including the side walls (W) of the semiconductor structure 20, and the mesa recess boundary wall 91. The reflective electrode layer 50 is located on the transparent conductive layer 40, the electrode coating layer 60 is disposed on the reflective electrode layer 50 and a part of the first insulating layer 32. Particularly, the reflective electrode layer 50 is located on the transparent conductive layer 40. The electrode coating layer 60 is stacked on top of the reflective electrode layer 50 and covers a portion of the first insulating layer 32. The second insulating layer 33 covers the first insulating layer 32 and the electrode coating layer 60. The third insulating layer 70 is located above the second insulating layer 33 and covering the second insulating layer 33. The first-electrode pad 212 and the second-electrode pad 232 are located above the third insulating layer 70, and each has a portion which passes downward through a portion of the third insulating layer 70. The first connecting electrode 211 is disposed between the second insulating layer 33 and the third insulating layer 70, and is electrically connected to the first-electrode pad 212. The third insulating layer 70 may be made of silicon dioxide ($SiO_2$), silicon nitride (SiN), aluminum oxide ($AL_2O_3$), or the third insulating layer 70 may be a distributed Bragg reflector (DBR) layer.

The light-emitting device 1 may further include a second connecting electrode 231. The second connecting electrode 231 is disposed between the third insulating layer 70 and the second insulating layer 33, and has one end (a top end as shown in FIG. 8) that is electrically connected to the second-electrode pads 232. The second connecting electrode 231 has another end (a bottom end) that is distal to the second-electrode pads 232, and that has one or more conductive pillars 233 which extend through the second insulating layer 33 to electrically connect with the electrode coating layer 60. More specifically, the second-electrode pads 232 partially extends through the third insulating layer 70, and is electrically connected to the electrode coating layer 60 via the second connecting electrode 231. In this embodiment, the first electrode 210 is formed by the first connecting electrode 211 and the first-electrode pad 212, and the second electrode 230 is formed by the second-electrode pad 232 and the second connecting electrode 231. In this case, the first electrode 210 may be an N-type electrode, and the second electrode 230 may be a P-type electrode. It should be noted, that the conductive pillars 233 depicted in FIGS. 5 and 8 are merely abstract representations and may not accurately indicate the physical location of the conductive pillars 233 relative to the second electrode 230. From a comparison of FIG. 8 with FIG. 4, it can be understood that the second embodiment may be modified by omitting the second connecting electrode 231 shown in FIG. 8, like the embodiment shown in FIG. 4. In this case, the third insulating layer 70 is located above the second insulating layer 33 and covers the second insulating layer 33 and the electrode coating layer 60. A portion of the second-electrode pad 232 passes through the third insulating layer 70 to be electrically connected to the electrode coating layer 60. The first electrode 210 is formed by the first-electrode pad 212, and the first connecting electrode 211, while the second electrode 230 takes the form of the second-electrode pad 232. The first electrode 210 may be an N-type electrode, and the second electrode 230 may be a P-type electrode.

The first connecting electrode 231 may have at least one conductive pillar 233. However, in this embodiment, the first connecting electrode 231 has three conductive pillars, as shown in FIG. 5. More specifically, the second connecting electrode 231 has the top surface that is electrically connected to the second-electrode pad 232, and the bottom surface that is electrically connected to the electrode coating layer 60 through the three conductive pillars 233, which thereby forms the P-type electrode of the light-emitting device 1. The number of conductive pillars 233 are not limited to the disclosed amount, and may be configured according to different design considerations of the second connecting electrode 231 and its surrounding components or adjusted according to practical requirements. Indeed, in some embodiments, the second connecting electrode 231 may have only two conductive pillars 233, while in other embodiments, the second connecting electrode 231 may have more than four conductive pillars 233.

Figure 11:
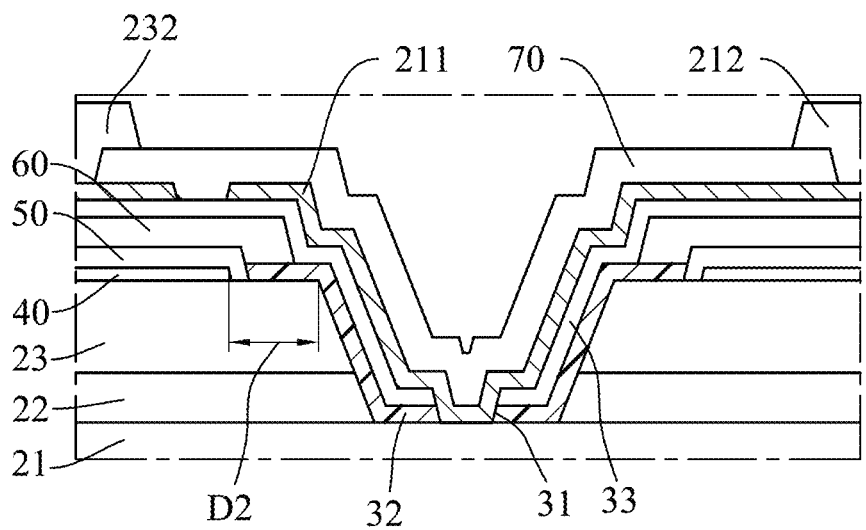
FIG. 11 is an enlarged schematic cross-sectional view of the B'-area shown in FIG. 8, showing a minimum distance D2.
Figure 20:
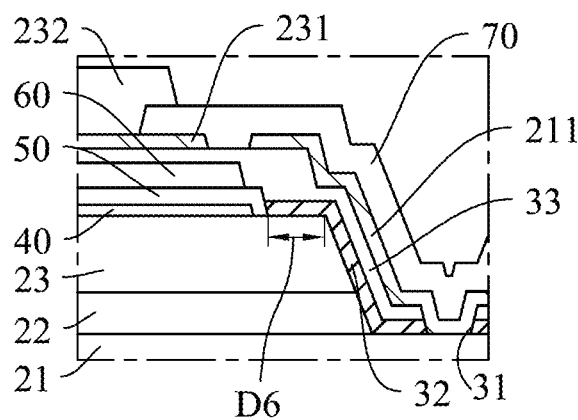
FIG. 20 is an enlarged schematic cross-sectional view of the H'-area shown in FIG. 18, showing a minimum distance D6.
Figure 21:
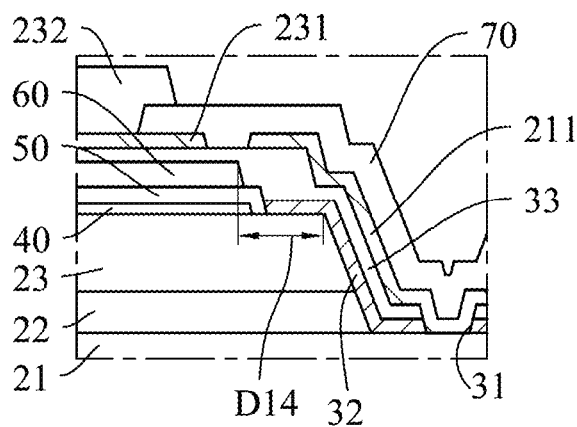
FIG. 21 is an enlarged schematic cross-sectional views of an H'-area shown in FIG. 18, showing the minimum distance D14.

Referring again to FIGS. 5 to 8, the first insulating layer 32 covers the border region (M) of the semiconductor structure 20, and the mesa recess boundary wall 91. The border region (M) of the semiconductor structure 20 as mentioned above, includes the top surface peripheral area (M1) of the second semiconductor layer 23. In this embodiment, the light-emitting device 1 is designed with a gap between the transparent conductive layer 40 and the first insulating layer 32 which the reflective electrode layer 50 then fills by covering the transparent conductive layer 40. This design ensures that the reflective electrode layer 50 may be in contact with the second semiconductor layer 23 while covering the transparent conductive layer 40. More specifically, a peripheral portion of the reflective electrode layer 50 contacts a portion of the top surface of the second semiconductor layer 23. The transparent conductive layer 40 has a portion that is connected to the top surface of the second semiconductor layer 23 while the rest of the transparent conductive layer 40 is completely surrounded by the reflective electrode layer 50. Referring to FIGS. 11 and 20, a minimum distance (D6) measured along the horizontal direction between an edge of a bottom surface of the reflective electrode layer 50 and the top boundary edge of the top surface of the second semiconductor layer 23 is less than a distance (D2) that is measured along the horizontal direction between an edge of a bottom surface of the transparent conductive layer 40 and the top boundary edge of the top surface of the second semiconductor layer 23. In some embodiments, the reflective electrode layer 50 may include at least one silver (Ag) reflective layer. Since there is higher adhesion between silver (Ag) and the second semiconductor layer 23 than between the transparent conductive layer 40 and the semiconductor layer 23, when the reflective electrode layer 50 completely covers the transparent conductive layer 40, and has a portion (the distance (D2)) that contacts the second semiconductor layer 23, the overall adhesion of the reflective electrode layer 50 is optimized and peeling defects occurring on the border regions of the reflective electrode layer 50 is prevented.

In other embodiments of the light-emitting device 1, there may be no gap between the transparent conductive layer 40 and the first insulating layer 32. In some embodiments, the reflective electrode layer 50 may further include an adhesion layer below the silver reflective layer that is made of a metal material such as titanium (Ti) or chromium (Cr). According to different microfabrication and design considerations, the first insulating layer 32 may partially cover the periphery of the transparent conductive layer 40.

In some embodiments, the first connecting electrode 211 and the first-electrode pad 212 form the first electrode 210, and the second-electrode pad 232 and the second connecting electrode 231 form the second electrode 230. In this case, the first electrode 210 is an N-type electrode, and the second electrode 230 is a P-type electrode. The first connecting electrode 211 fills the electrode passage hole 31 to form an electrical connection between the first semiconductor layer 21, the first connecting electrode 211 and the first-electrode pad 212. The second-electrode pad 232 is connected to the electrode coating layer 60 via the second connecting electrode 231 and the conductive pillars 233.

Figure 6:
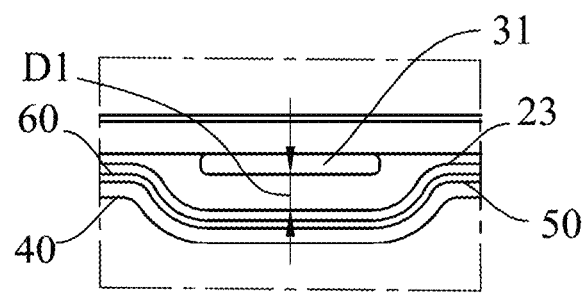
FIG. 6 is an enlarged schematic top view of a D-area shown in FIG. 5, showing a minimum distance D1.
Figure 7:
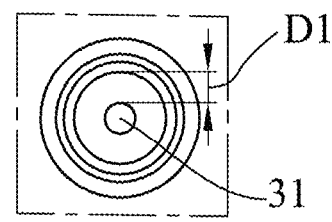
FIG. 7 is an enlarged schematic top view of an E-area shown in FIG. 5, showing the minimum distance D1.

Referring to FIGS. 5 and 8, the electrode passage holes 31 may be distributed throughout the light-emitting device 1, for example, in the border and inside regions (M) and (E) of the semiconductor structure 20. FIG. 6 shows a D-area of the border region (M) encircled by a rectangular phantom line in FIG. 5. When an electrode passage hole 31 is located in the border region (M), the minimum distance (D1) and the positions of the electrode passage hole 31, the mesa recess boundary wall 91, the transparent conductive layer 40, the reflective electrode layer 50 and the electrode coating layer 60 are shown in FIG. 6. FIG. 7 shows an E1-area of the inside region (E) encircled by a rectangular phantom line in FIG. 5. When an electrode passage hole 31 is located on an inside region (E) of the semiconductor structure 20, measurement of the minimum distance (D1) is schematically shown in FIG. 7.

Figure 9:
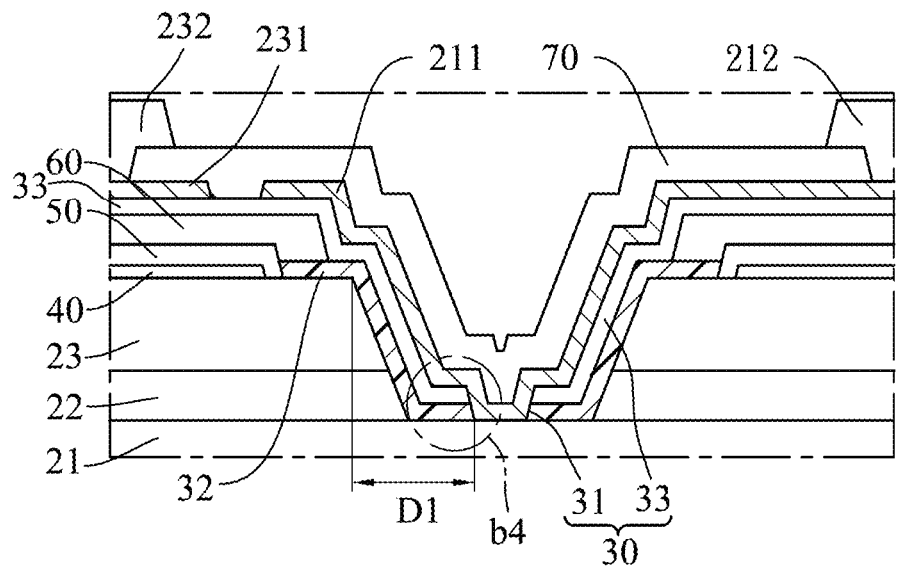
FIG. 9 is an enlarged schematic cross-sectional view of a B'-area shown in FIG. 8, showing the minimum distance D1.

Referring to FIG. 9, the minimum distance (D1) is preferably no less than 1 μm. In some embodiments, the minimum distance (D1) is greater than or equal to 2 μm. For example, the minimum distance (D1) may be between 2 μm and 12 μm, or between 1 μm and 8 μm. In some embodiments the light-emitting device 1 is designed to have a raised film platform formed near the top surface of the first semiconductor layer 21 after the insulating layer 30 is etched. The minimum distance (D1) ensures the insulating layer 30 will have sufficient thickness between an electrode hole boundary of the electrode passage hole 31 and the mesa recess boundary wall 91 of the semiconductor structure 20 so that the semiconductor structure 20 is sufficiently insulated. The light-emitting device 1 will thus have better insulation protection, moisture resistance and anti-leakage properties. Without the raised film platform on the top surface of the first semiconductor layer 21, the thickness of the insulating layer 30 on the side walls of the semiconductor structure 20 will be thin. This is because the insulating layer 30 formed by deposition on the side walls of the semiconductor structure 20 is generally thin and lateral etching occurring in the buffered oxide etch (BOE) process for forming the electrode passage hole 31 may further reduce the thickness of the already thin insulating layer 30. Both these factors contribute to the insulating layer 30 being substantially thinner on the side walls of the semiconductor structure 20, which consequently impairs the obtaining of an even metal coating in subsequent processes, and increases the risk of LED chip and packaging leakage, and moisture resistance in light-emitting devices 1 thus manufactured.

Referring to FIGS. 6 to 9, the electrode passage hole 31 passes through the first and second insulating layers 32, 33, and the first and second insulating layers 32, 33 are respectively formed with inclined hole boundary surfaces of the electrode passage hole 31.

Figure 10:
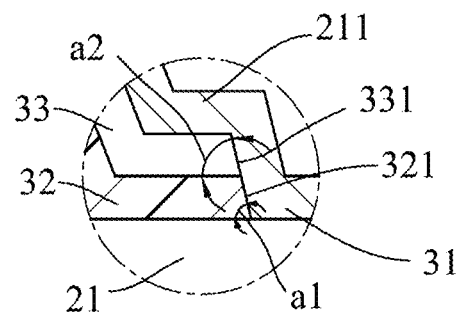
FIG. 10 is an enlarged schematic cross-sectional view of a b4-area shown in FIG. 9, showing an angle a1.

In some embodiments, an angle of the inclined hole boundary surface of the electrode passage hole 31 that is inclined with the top surface of the first semiconductor layer 21 is no greater than 50°. Referring to FIGS. 9 and 10, the first insulating layer 32 has an inclined hole boundary surface 321 of the electrode passage hole 31, that forms an interior angle (a1) with a bottom surface of the first insulating layer 32 and that is no greater than 50°. The second insulating layer 33 has an inclined hole boundary surface 331 of said electrode passage hole 31 that forms an interior angle (a2) with a bottom surface of the second insulating layer 33 and that is no greater than 50°. The inclined hole boundary surfaces 321, 331 of the electrode passage hole 31 and the interior angles (a1), (a2) ensure that areas of the first and second insulating layers 32, 33 near the electrode passage hole 31 retain sufficient thickness after etching, and help ensure that the semiconductor structure 20 has sufficient electrical insulation and leakage prevention. In some embodiments, the angle (a1) may be no greater than 30°, and greater than 0°. The interior angles (a1), (a2) of the first and second insulating layers 32, 33 facilitate coating and structural formation of subsequent structural layers (metal layers, dielectric layers) of the microfabrication process, and thereby improve the photoelectric characteristics of the light-emitting device 1. However, it should be noted that if the interior angles (a1), and (a2) of the respective first and second insulating layers 32, 33 are made too large, the third insulating layer 70 and subsequent metal layers that cover the first and second insulating layers 32, 33 may have a higher chance of fracture.

The transparent conductive layer 40 facilitates current spreading, and may prevent current crowding effect (CCE) occurring in one region or multiple regions of the second semiconductor layer 23, and ensure homogeneous current distribution in the second semiconductor layer 23. The transparent conductive layer 40 may have a thickness that is between 5 nm and 150 nm. The thickness of the transparent conductive layer 40 may be configured to fit the intended application of the light-emitting device 1 or to match specific design considerations and requirements. In some embodiments, the transparent conductive layer 40 may have a thickness that is between 10 nm and 60 nm. When the thickness of the transparent conductive layer 40 is within this range, the forward voltage of the light-emitting chip may be kept stable, and the light absorption of the transparent conductive layer 40 is less of a concern. However, when the transparent conductive layer 40 is over 60 nm in thickness, the effects of light absorption is much more noticeable, and will have a detrimental effect on the light emission efficiency of the light-emitting device 1 (in this case the light generated by the light-emitting device 1 exits from the side of the substrate 10). In some embodiments, the transparent conductive layer 40 has a thickness that is between 20 nm and 30 nm, which strikes a good balance between forward voltage stability and light emission efficiency. In some embodiments, the transparent conductive layer 40 is between 40 nm and 50 nm, this allows the light-emitting device 1 to have even lower forward voltage.

Additionally, in some embodiments, the transparent conductive layer 40 may undergo a patterning process to form a patterned surface with patterned structures. The patterned structures on the surface of the transparent conductive layer 40 may help decrease light absorption, and increase the light emission efficiency of the light-emitting device 1.

Referring to FIGS. 8 and 11, in some embodiments, a predetermined minimum distance (D2) is provided between the transparent conductive layer 40 and the top boundary edge of the top surface of the second semiconductor layer 23. In this embodiment, the transparent conductive layer 40 is covering a portion of the top surface of the second semiconductor layer 23 which reduces leakage (also known as IR reverse leakage current) and risk of abnormal electrostatic discharge (ESD). In this embodiment, the transparent conductive layer 40 may include indium tin oxide (ITO), and the minimum distance (D2) is no less than 2 μm.

Referring to FIG. 11, in some embodiments the minimum distance (D2) between an edge of a top surface of the transparent conductive layer 40 and a top boundary edge of the second semiconductor layer 23 may be no less than 10 μm and no greater than 16 μm. Such a design may maximize the surface area of the transparent conductive layer 40 while maintaining contact between the reflective electrode layer 50 and the second semiconductor layer 23, increase ohmic contact of the P-type electrode, decrease voltage, and decrease leakage and probability of abnormal electrostatic discharge (ESD) in the light-emitting device 1.

Figure 12:
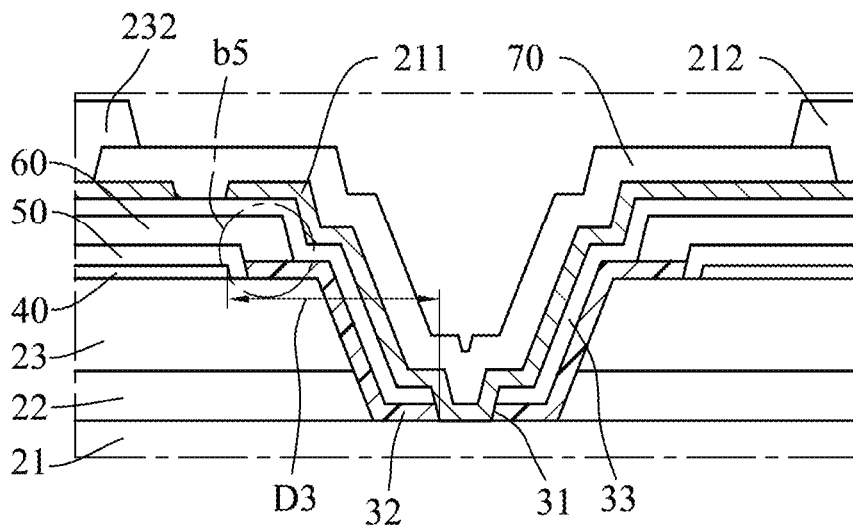
FIG. 12 is an enlarged schematic cross-sectional view of the B'-area shown in FIG. 8, showing a minimum distance D3.
Figure 28:
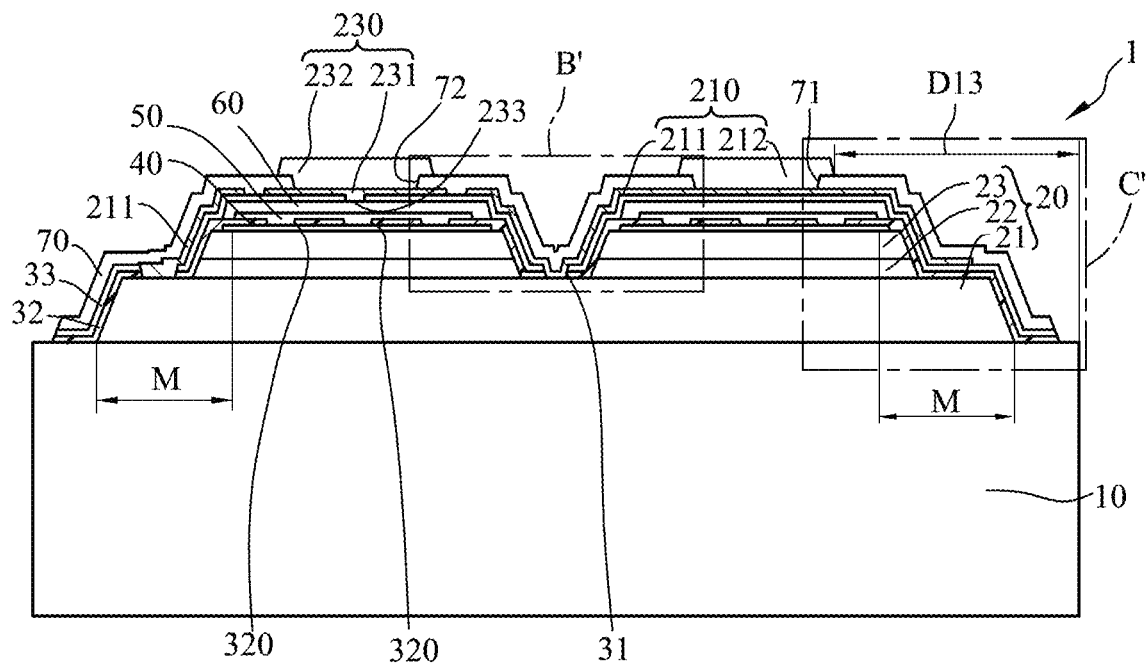
FIG. 28 is a schematic cross-sectional view taken along line Y-Y in FIG. 25.
Figure 32:
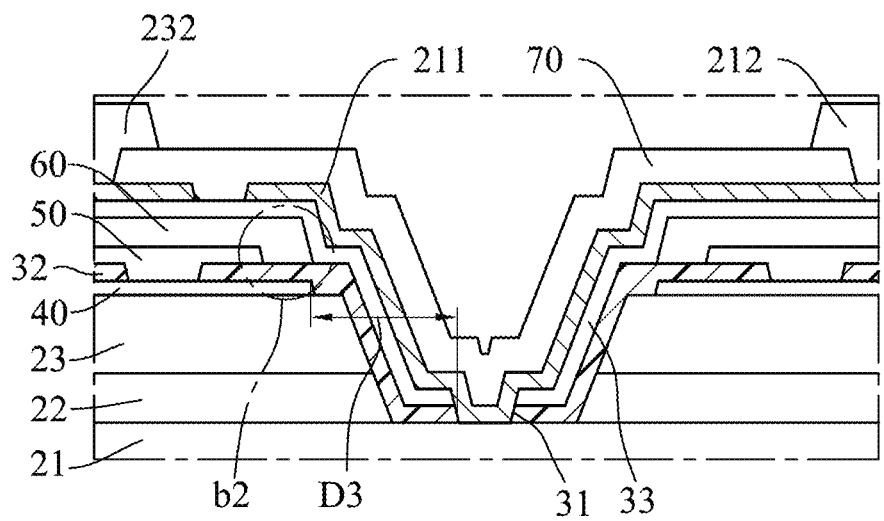
FIG. 32 is an enlarged schematic cross-sectional views of the B'-area shown in FIG. 28, showing the minimum distance D3.
Figure 33:
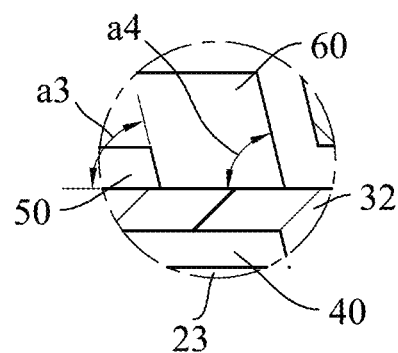
FIG. 33 is an enlarged schematic cross-sectional view of a b2-area in FIG. 32, showing an angle a3, and an angle a4.

Referring to FIGS. 8 and 12, and also FIGS. 28 and 32, in some embodiments, there is a predetermined minimum distance (D3) between the transparent conductive layer 40 and an edge of the first connecting electrode 211 that is in contact with the first semiconductor layer 21. The minimum distance (D3) may prevent IR reverse leakage current and abnormal electrostatic discharge. Referring to FIGS. 12 and 32, the first connecting electrode 211 is filled into the electrode passage hole 31, and the first connecting electrode 211 is electrically connected to the first semiconductor layer 21 through the electrode passage hole 31. The minimum distance (D3) may also be a distance between the top boundary edge of the top surface of the transparent conductive layer 40 and the hole boundary surface of the electrode passage hole 31. The minimum distance (D3) is no less than 4 μm, and preferably greater than 6 μm. If the minimum distance (D3) is too little there is a greater chance of leakage in the light-emitting device 1 due to the greater proximity between the P-type electrode (the first electrode 210) and the N-type electrode (the second electrode 230).

Referring to FIGS. 12 and 32, the minimum distance (D3) is no less than 4 μm and no greater than 20 μm. Since the minimum distance (D3) between the top boundary edge of the top surface of the transparent conductive layer 40 and the hole boundary surface of the electrode passage hole 31 encompasses the minimum distance (D1) measured from the bottom end of the electrode passage hole 31 to the top boundary edge of the second semiconductor layer 23, the minimum distance (D3) is therefore no less than 2 μm, where the minimum distance (D1) is 1 μm. A distance between an opening of the second insulating layer 33, which forms the electrode passage hole 31, and the top boundary edge of the top surface of the second semiconductor layer 23 is no less than 1 μm. By having the minimum distance (D3), the light-emitting device 1 will have adequate spacing between the transparent conductive layer 40 and the mesa recess 9 of the semiconductor structure 20 to prevent leakage and abnormal electrostatic discharge (ESD) in the light-emitting device 1. Additionally, the minimum distance (D3) ensures that there is enough horizontal spacing between the second insulating layer 33 and the mesa recess 9 of the semiconductor structure 20 so that the light-emitting device 1 has better electrical insulation and anti leakage properties.

The reflective electrode layer 50 may include a metal reflection layer to provide the light-emitting device 1 with superior photoelectric characteristics. In some embodiments, the reflective electrode layer 50 may include a metal reflective layer and at least one diffusion barrier layer. The metal reflective layer may be made of silver (Ag) or aluminum (Al). The at least one diffusion barrier layer may be made of a pure metal or an alloy, that may include, but is not limited to nickel (Ni), titanium (Ti), tungsten (W), platinum (Pt), or any combination thereof. The at least one diffusion barrier layer has a total thickness that is greater than 200 nm.

In some embodiments, the reflective electrode layer 50 may be formed by stacking a silver (Ag) layer with a Ti/W/Ti stack and a Ni/Ti/W stack. In these instances, the silver (Ag) layer may act as the reflection layer, and the Ti/W/Ti and Ni/Ti/W stacks act as the diffusion barrier layer to prevent metal diffusion of the silver (Ag) layer. In these designs, the structure of the reflective electrode layer 50 itself has the effect of self-encapsulating the silver (Ag) layer. In some embodiments, the reflective electrode layer 50 is at least partially in contact with the transparent conductive layer 40. In some embodiments, the reflective electrode layer 50 may include an additional titanium (Ti) or chromium (Cr) bottom layer which may act as an adhesion layer between the reflective electrode layer 50 and the transparent conductive layer 40 to intensify the adhesion strength between these two components. In some embodiment, the reflective electrode layer 50 has a titanium (Ti) bottom layer upon which a silver (Ag) layer is stacked, and a Ti/W/Ti stack is stacked on top of the silver (Ag) layer.

Figure 13:
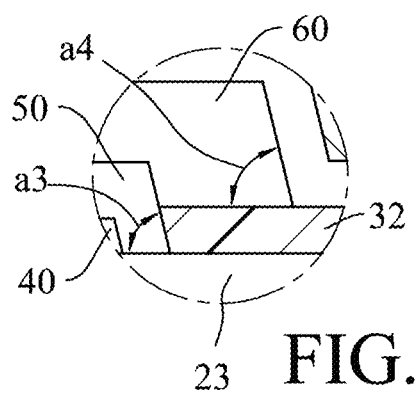
FIG. 13 is an enlarged schematic cross-sectional view of a b5-area shown in FIG. 12, showing an angle a3, and an angle a4.

In some embodiments, the reflective electrode layer 50 may contact the first insulating layer 32. In these cases, the bottom layer of the reflective electrode layer 50 which contacts the first insulating layer 32 may be made of chromium (Cr), titanium (Ti), or a titanium chromium alloy to strengthen adhesion between the reflective electrode layer 50 and the first insulating layer 32. Referring to FIG. 13, in some embodiments, the reflectivity of the reflective electrode layer 50 is no less than 90%, and an interior angle (a3) formed between a side wall and a bottom surface of the reflective electrode layer 50 is greater than 0° and no greater than 30°. Additionally, the reflectivity of the electrode coating layer 60 is no less than 60%, and an interior angle (a4) formed between a side wall and a bottom surface of the electrode coating layer 60 is greater than 0° and no greater than 60°.

Figure 16:
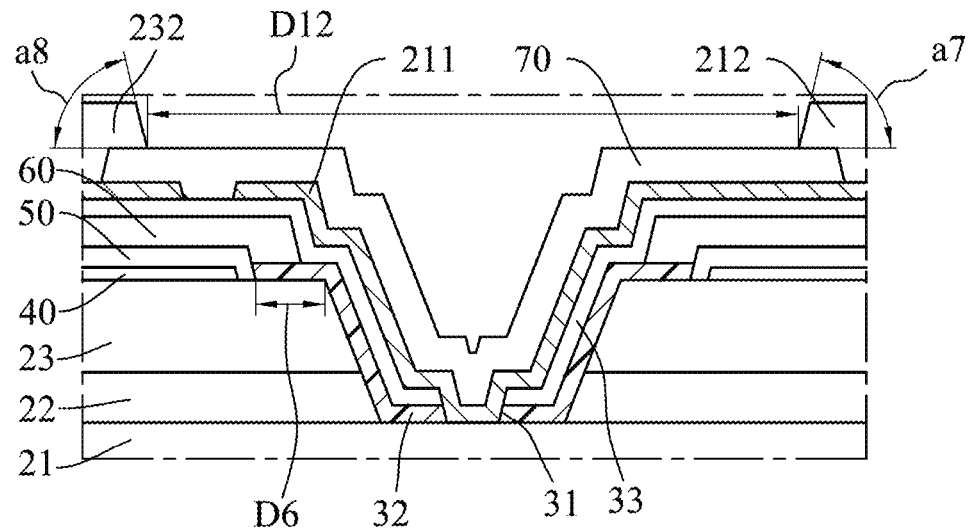
FIG. 16 is an enlarged schematic cross-sectional view of the B'-area, showing a minimum distance D12.

Referring back to FIGS. 8 and 12, the electrode coating layer 60 is formed on top of the reflective electrode layer 50, and partially covers the top surface of the first insulating layer 32. In some embodiments, the electrode coating layer 60 may cover the top surface and partially cover the side walls of the reflective electrode layer 50, to protect the aluminum (Al) or silver (Ag) metal reflective layer of the reflective electrode layer 50 and prevent metal diffusion of the aluminum (Al) or silver (Ag). Referring to FIGS. 16 and 20, a minimum distance (D6) is a predetermined distance that is measured along the horizontal direction between an edge of a bottom surface of the reflective electrode layer 50 and the top boundary edge of the top surface of the second semiconductor layer 23. The minimum distance (D6) provides sufficient space for the forming of the reflective electrode layer 50, and ensures sufficient spacing between the electrode coating layer 60 and the mesa recess 9 of the semiconductor structure 20 which decreases the risk of electrostatic discharge (ESD). The minimum distance (D6) is preferably greater than 5 μm. For example, 7 μm, 10 μm, or 12 μm, 15 μm are all reasonable values that the minimum distance (D6) may have.

Figure 17:
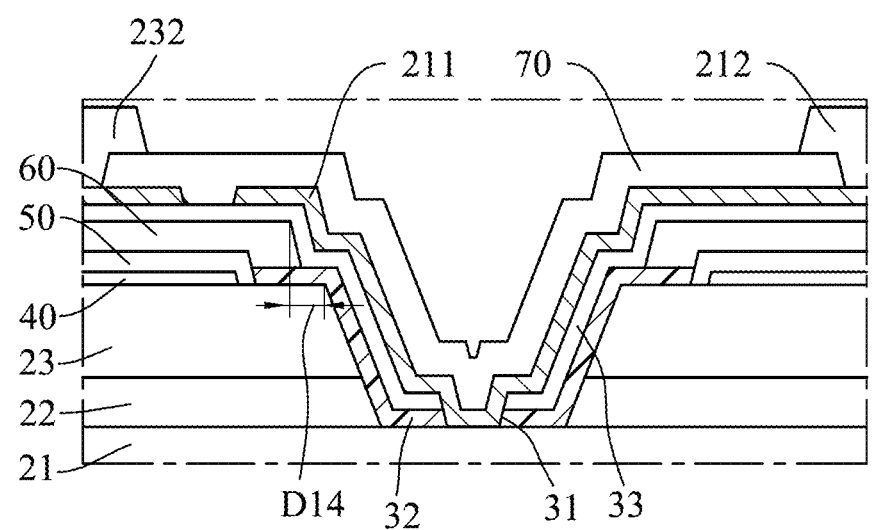
FIG. 17 is an enlarged schematic cross-sectional view of the B'-area shown in FIG. 8, showing a minimum distance D14.

Referring to FIGS. 8 and 17, in some embodiments, a minimum distance (D14) is between an edge of a top surface of the electrode coating layer 60 to the top boundary edge of the top surface of the second semiconductor layer 23. The minimum distance (D14) may be no less than 5 µm, and no greater than 20 µm. Referring to the FIGS. 8 and 17, and FIGS. 28 and 41, in some embodiments, the electrode coating layer 60 partially covers the top surface and the side walls of the reflective electrode layer 50. The minimum distance (D14) may be no less than 5 µm, and no greater than 15 µm. The minimum distance (D14) may help ensure there is sufficient spacing between the electrode coating layer 60 and the side walls of the semiconductor structure 20, and prevent leakage and damage from electrostatic discharge (ESD).

Figure 18:
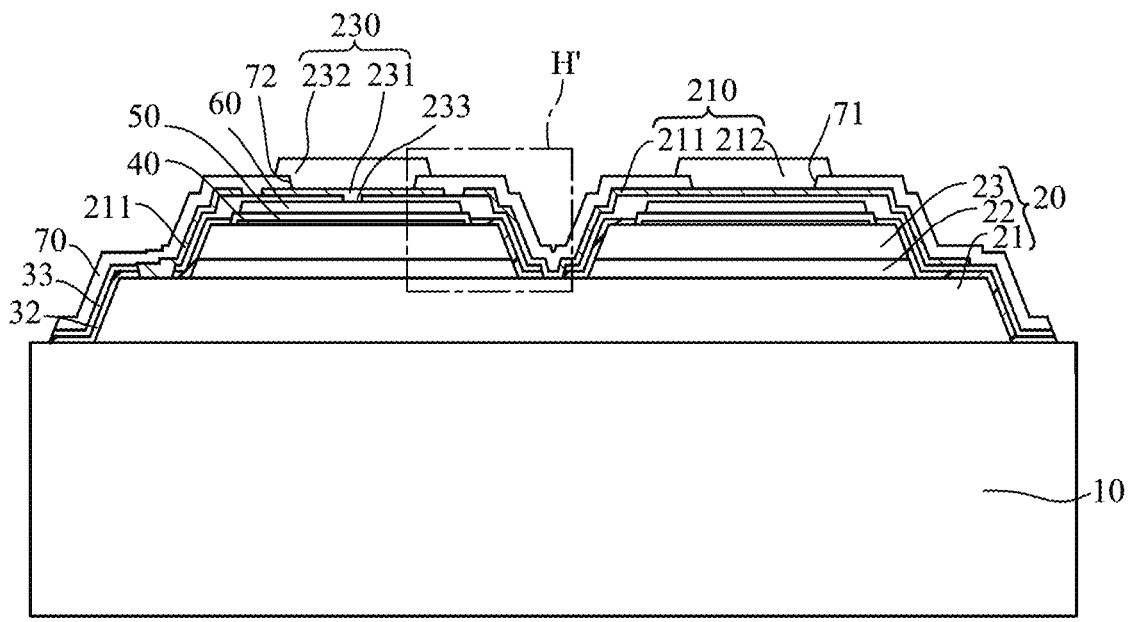
FIG. 18 is a schematic cross-sectional view of a variation of the second embodiment of the light-emitting device.

In other embodiments, the light-emitting device 1 is suitable for operation at low current density, and the electrode coating layer 60 may be omitted. According to operating conditions and practical requirements, the electrode coating layer 60 may completely cover the reflective electrode layer 50 (as shown in FIG. 8), or the electrode coating layer 60 may only partially cover the reflective electrode layer 50 (as shown in FIG. 18). In this case where the reflective electrode layer 50 is partially covered by the electrode coating layer 60, a projection of the bottom surface of the electrode coating layer 60 is within confines of a projection of a top surface of the reflective electrode layer 50, when the bottom surface of the electrode coating layer 60 and the top surface of the reflective electrode layer 50 are projected onto the imaginary plane and viewed from above the top of the semiconductor structure 20.

Referring to FIGS. 18 and 21, and FIGS. 42 and 45, in some embodiments, the electrode coating layer 60 partially covers a portion of the top surface of the reflective electrode layer 50, the minimum distance (D14) may be no less than 7 µm and no greater than 20 µm. The light-emitting device 1 designed with the minimum distance (D14) may allow the reflective electrode layer 50 to be allocated with the maximum amount of surface area while ensuring that the electrode coating layer 60 has maximum amount of contact with the reflective electrode layer 50 so that current spreading and heat dissipation may be optimized and the brightness of the light-emitting device 1 may be increased. In this case, the electrode coating layer 60 may provide a decent current spreading effect which is particularly beneficial for high powered LED devices since the overall brightness of the LED chip may be increased. An application of which is LEDs used in car headlamps. A more in depth explanation is that more contact between the reflective electrode layer 50 and the electrode coating layer 60 allows for the flow of the current to spread-out transversely which means a more uniform distribution of the current may be achieved.

It should be noted that, in the example given above, the electrode coating layer 60 only partially covers a portion of the reflective electrode layer 50. In other words, the reflective electrode layer 50 is not completely covered by the electrode coating layer 60 and therefore the electrode coating layer 60 may not effectively prevent metal diffusion of the silver (Ag) metal reflective layer of the reflective electrode layer 50, but instead the electrode coating layer 60 is primarily there to provide an increased current spreading effect. It can be understood, that in these embodiments, the electrode coating layer 60 acts as a metal current spreading layer 60. The metal current spreading layer 60 may be a pure metal or an alloy and may be made of one of a chromium (Cr), aluminum (Al), titanium (Ti), platinum (Pt), gold (au), nickel (Ni), and tungsten (W) metal material or made of a metal alloy using any combination thereof. In other embodiments, the electrode coating layer 60 may have a stacked structure, each layer of the stacked structure may be made of chromium (Cr), aluminum (Al), titanium (Ti), platinum (Pt), gold (au), nickel (Ni), tungsten (W), or any combination thereof. The electrode coating layer 60 with the stacked structure has a total thickness that is between 300 nm and 2000 nm to ensure that the electrode coating layer 60 has good electrical conductivity and that the light-emitting device 1 may have improved current spreading, when the electrode coating layer 60 is used as a metal current spreading layer.

Referring to FIGS. 18 and 19, and FIGS. 42 and 43, showing an embodiment of the light-emitting device 1, a minimum distance (D5) is a predetermined distance between an edge of the bottom surface of the electrode coating layer 60 and an edge of the bottom surface of the reflective electrode layer 50. The minimum distance (D5) may be between 2 µm to 10 µm and more preferably 2 µm to 6 µm. In this type of structure, the reflective electrode layer 50 has its own protection layer to prevent diffusion of the silver (Ag) metal reflective layer of the reflective electrode layer 50. This type of structure is designed to allocate maximum surface area to the reflective electrode layer 50 while ensuring that metal diffusion of the silver (Ag) metal reflective layer is prevented, and improve the light emission efficiency and light extraction of the light-emitting device 1. It should be noted that the electrode coating layer 60 is included in the light-emitting device 1 primarily for the purpose of electrical conduction, where the conduction might be between second connecting electrode 231 and the second semiconductor layer 23.

Figure 19:
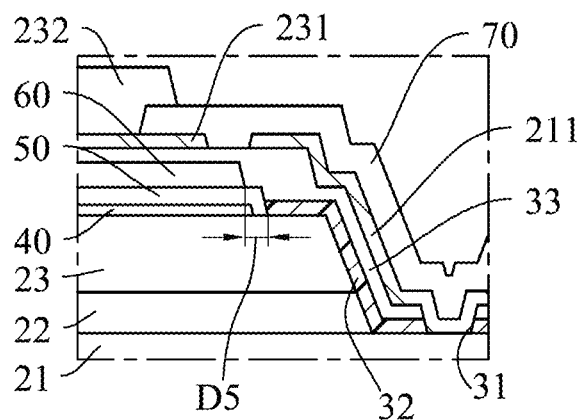
FIG. 19 is an enlarged schematic cross-sectional view of an H'-area shown in FIG. 18, showing a minimum distance D5.

Referring to FIGS. 18 and 19, in a preferred embodiment, the reflective electrode layer 50 is composed of a silver (Ag) metal reflective layer stacked with multiple paired stacks of Ni/TiW. The total thickness of the multiple metal-layered stacks of the reflective electrode layer 50 is 200 nm. Since in this preferred embodiment, the reflective electrode layer 50 already includes metal diffusion prevention for the silver (Ag) metal reflective layer, the total surface area of the electrode coating layer 60 may be made smaller than the total surface area of the reflective electrode layer 50. In this way, more surface area may be allocated for the reflective electrode layer 50 and the brightness of the light-emitting device 1 may be increased. This particular design is applicable to high power LED devices, such as car headlamps, and display backlights. However, the design is equally applicable to small current devices such as LED grow lights for plants.

Figure 42:
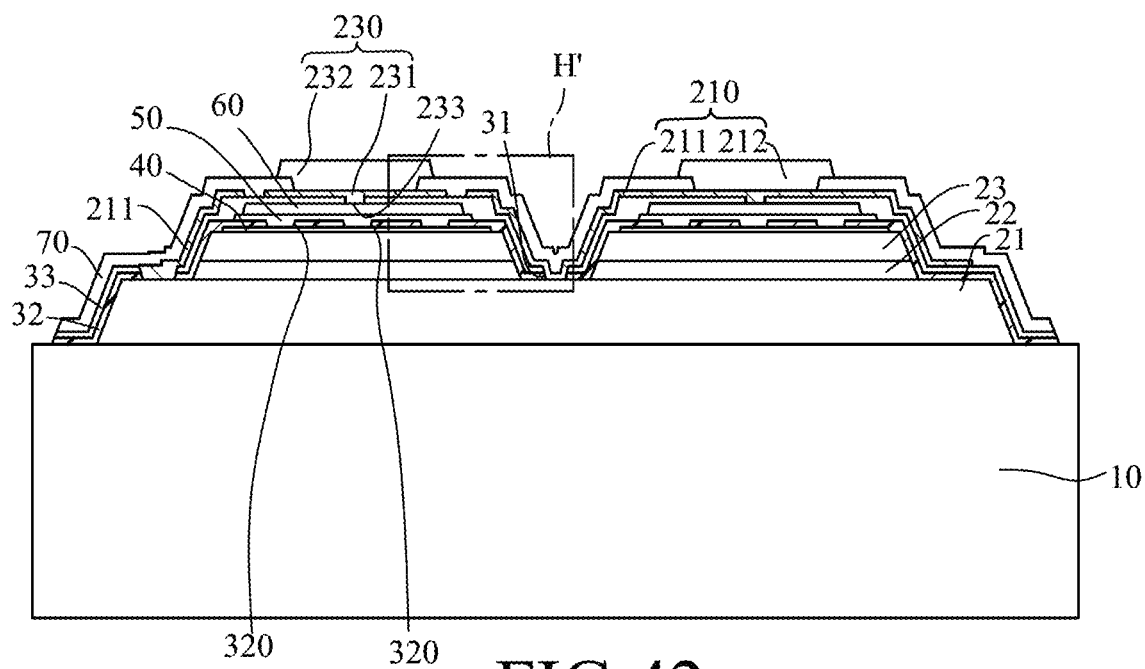
FIG. 42 is a schematic cross-sectional view of a variation of the third embodiment of the light-emitting device.
Figure 43:
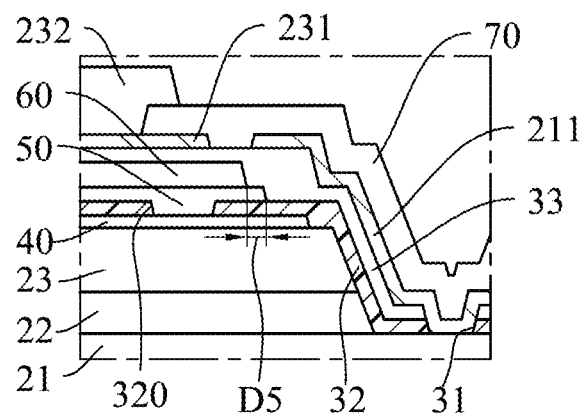
FIG. 43 is an enlarged schematic cross-sectional view of an H'-area in FIG. 42, showing the minimum distance D5.
Figure 44:
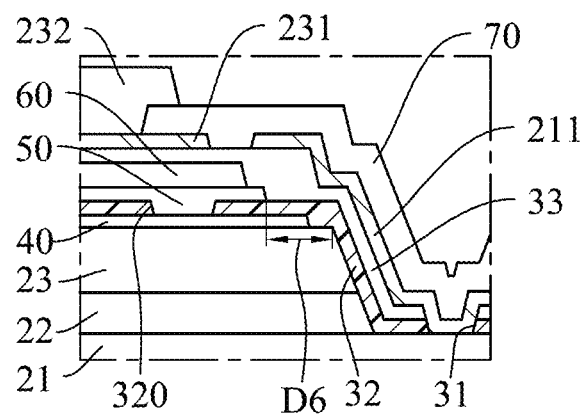
FIG. 44 is an enlarged schematic cross-sectional view of the H'-area in FIG. 42, showing the minimum distance D6.
Figure 45:
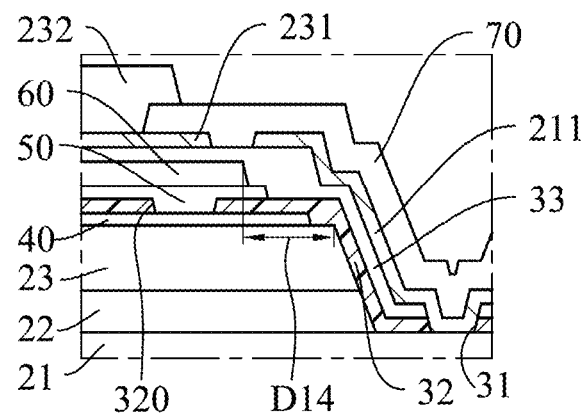
FIG. 45 is an enlarged schematic cross-sectional view of the H'-area in FIG. 42, showing the minimum distance D14.

Referring to FIGS. 42 and 43, in some embodiments, the reflective electrode layer 50 includes a stack of titanium, silver, titanium-tungsten and titanium layers (i.e., a Ti/Ag/TiW/Ti stack). Additionally, the reflective electrode layer 50 partially fills a second through hole 320 of the first insulating layer 32 to contact the transparent conductive layer 40. The bottom layer of the reflective electrode layer 50 includes titanium (Ti) and acts as an adhesion layer between the reflective electrode layer 50 and the transparent conductive layer 40, to enhance the adhesion strength between the reflective electrode layer 50 and the transparent conductive layer 40. In this embodiment, a silver (Ag) layer is stacked on a Ti/W/Ti stack, which in turn is stacked on the Ti bottom layer. Therefore, the reflective electrode layer 50 is self-protective and diffusion of silver (Ag) of the reflective electrode layer 50 is prevented.

Referring to FIGS. 18 and 20, and FIGS. 42 and 44, in some embodiments, a predetermined minimum distance (D6) is provided between an edge of the bottom surface of the reflective electrode layer 50 to the top boundary edge of the top surface of the second semiconductor layer 23. In some embodiments, the minimum distance (D6) is greater than 0 μm and less than 13 μm, so that more surface area may be allocated to the reflective electrode layer 50 and ensure stability of the light-emitting device 1. For example, the minimum distance (D6) is 2 μm, 5 μm, 7 μm, 10 μm, or 13 μm. The minimum distance (D6) is preferably greater than 2 μm to prevent silver (Ag) diffusion into the side walls of the semiconductor structure 20 and cause leakage or abnormal electrostatic discharge during an etching process. In preferred embodiments, the area of the bottom surface of the reflective electrode layer 50 is over 90% of the area of the top surface of the second semiconductor layer 23.

Figure 14:
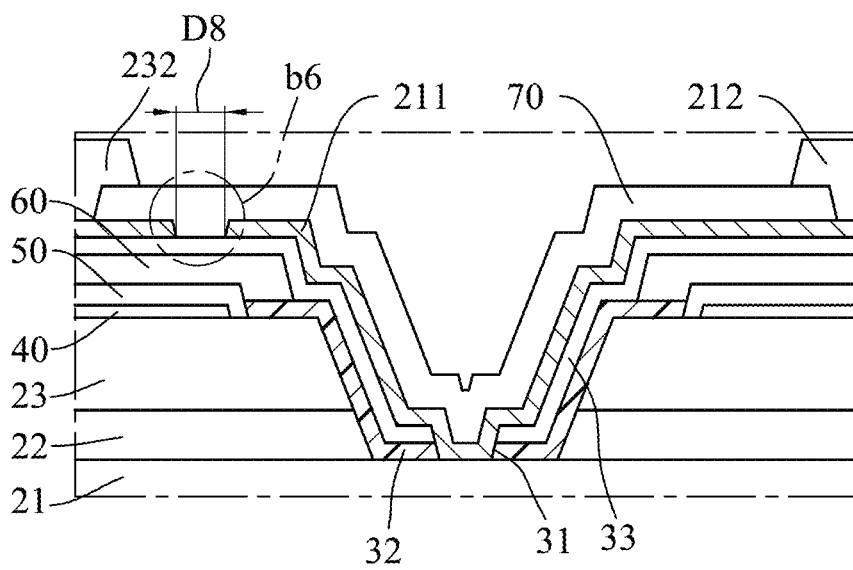
FIG. 14 is an enlarged schematic cross-sectional view of the B'-area shown in FIG. 8, showing a distance D8.
Figure 60:
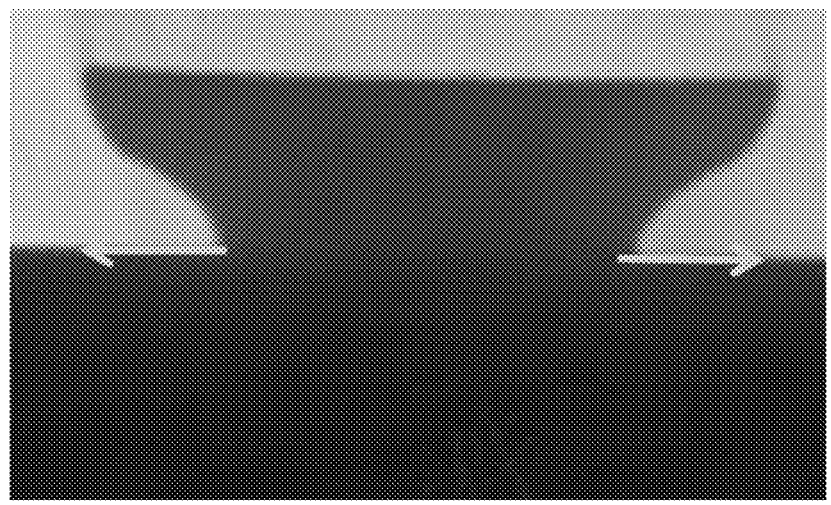
FIG. 60 is a fragmentary scanning electron microscope (SEM) image of an undercut structure formed during a manufacturing process of the light-emitting device.

Referring to FIGS. 8 and 14, in some embodiments, a minimum distance (D8) between the first connecting electrode 211 and the second connecting electrode 231 is no less than 10 μm and no greater than 50 μm. In some embodiments, the minimum distance (D8) between the first connecting electrode 211 and the second connecting electrode 231 may be no less than 15 μm and no greater than 80 μm. In the processing of the first connecting electrode 211 and the second connecting electrode 231, a yellow light lithography process is performed using a photoresist to form a patterned mask layer which may be an undercut structure (see the regions near the arrows in FIG. 60). The undercut structure has a roughly isosceles trapezoid cross-section, a minimum distance between the two sides (as opposed to between the top and bottom) is from around 2 μm to 6 μm. When the minimum distance (D8) between the first connecting electrode 211 and the second connecting electrode 231 is less than 10 μm, there is a higher risk of the photoresist peeling off during the vapor deposition of the first connecting electrode 211 and the second connecting electrode 231. Therefore, by limiting the minimum distance (D8) to be no greater than 50 μm, the surface area of the first and second connecting electrodes 211, 231 may be maximized, which facilitates current spreading and heat dissipation in the light-emitting device 1.

Figure 15:
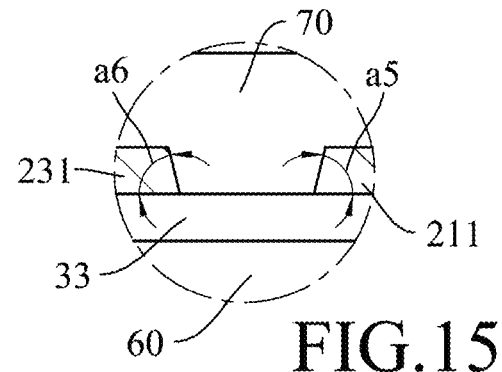
FIG. 15 is an enlarged schematic cross-sectional view of a b6-area shown in FIG. 14, showing an angle a6, and an angle a7.

In some embodiments, the reflectivity of the first connecting electrode is higher than 70%, and may be made of a high reflectivity metal such as, including but not limited to, aluminum (Al), silver (Ag), ruthenium (Ru), and rhodium (Rh). The reflectivity of the second connecting electrode is also higher than 70%, and may be made of a high reflectivity metal such as, including but not limited to, aluminum (Al), silver (Ag), ruthenium (Ru), and rhodium (Rh). Referring to FIG. 15, an interior angle (a5) formed between a side wall and a bottom surface of the first connecting electrode 211 is more than 0° and no greater than 60°, and an interior angle (a6) formed between a side wall and a bottom surface of the second connecting electrode 231 is more than 0° and no greater than 60°. Additionally, the thickness of the first and second connecting electrode 211, 231 are both greater than 500 nm.

Referring to FIG. 16, an interior angle (a7) is formed between a side wall and a bottom surface of the first-electrode pad 212, which is more than 0° and no greater than 70°, while an interior angle (a8) is formed between a side wall and a bottom surface of the first-electrode pad 232, which is more than 0° and no greater than 70°.

Figure 22:
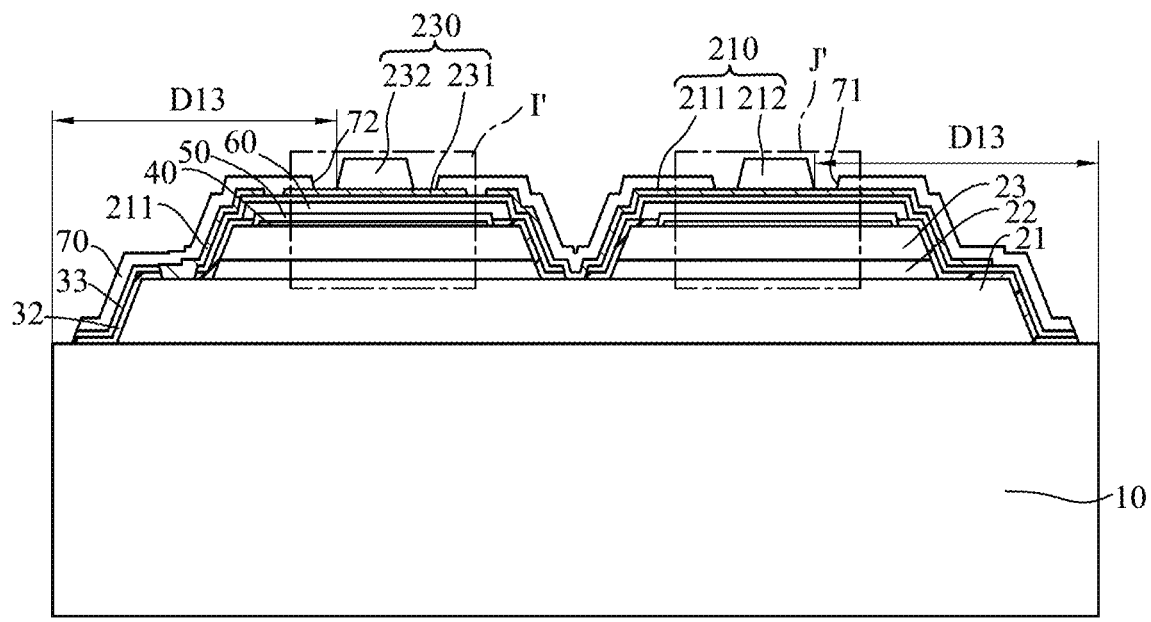
FIG. 22 is a schematic cross-sectional view illustrating another variation of the second embodiment of the light-emitting device.
Figure 23:
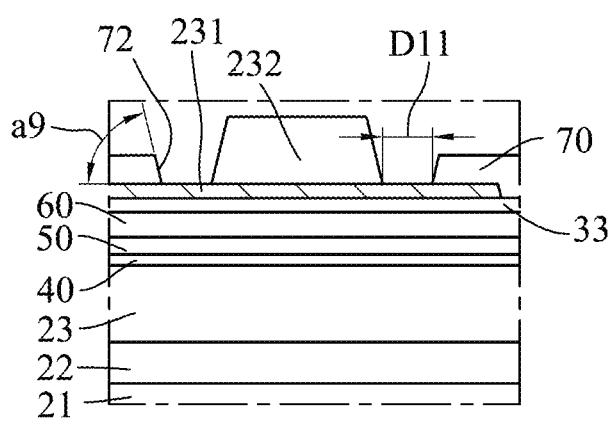
FIG. 23 is the enlarged schematic cross-sectional views of an I'-area shown in FIG. 22, showing a minimum distance D11.
Figure 46:
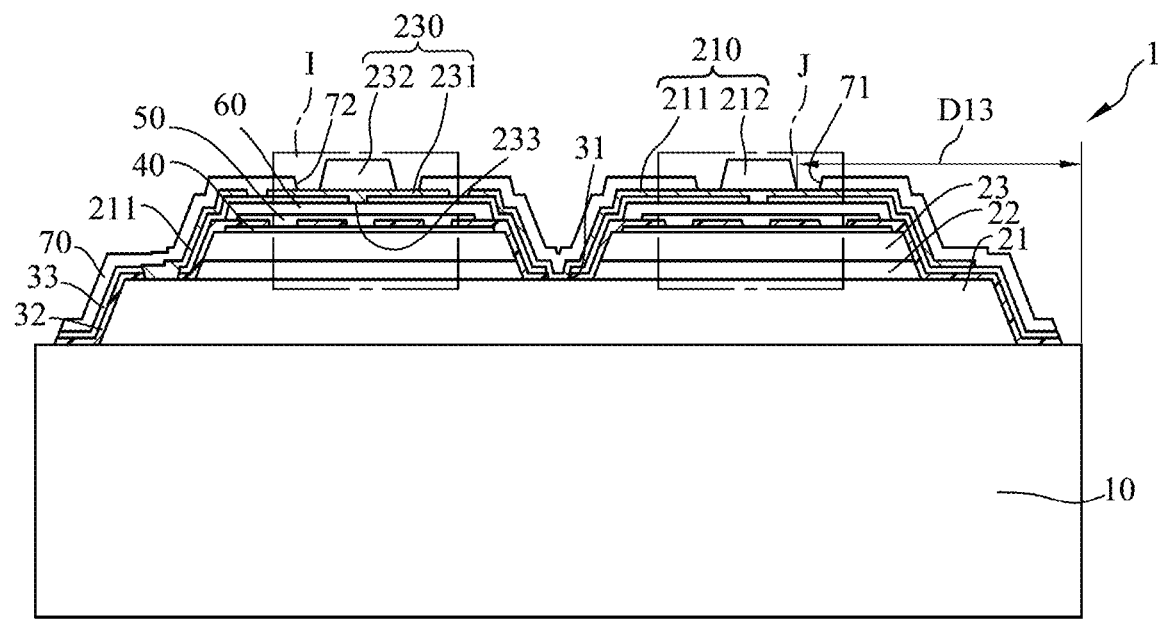
FIG. 46 is a schematic cross-sectional view of another variation of the third embodiment of the light-emitting device.
Figure 47:
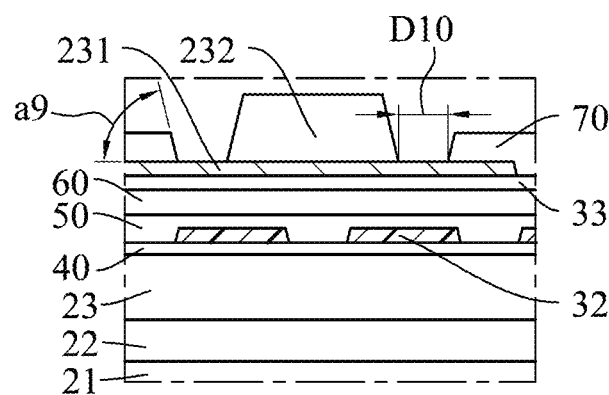
FIG. 47 is an enlarged schematic cross-sectional view of an I-region in FIG. 46, showing an angle a9 and the minimum distance D10.
Figure 48:
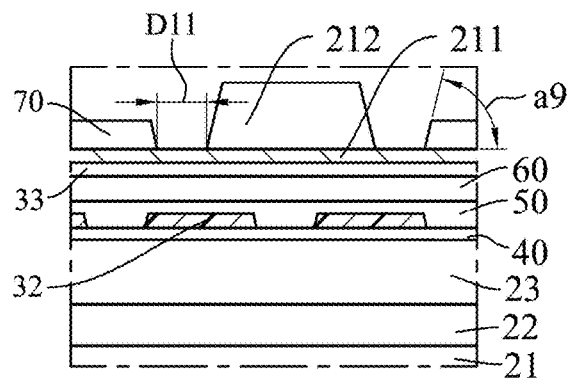
FIG. 48 is an enlarged schematic cross-sectional view of a J-region in FIG. 46, showing the minimum distance D11, and an angle a9.

Referring to FIGS. 18 and 28, in some embodiments, the third insulating layer 70 has a first through-hole 71 and a second through-hole 72. The first-electrode pad 212 may fill the first through-hole 71 and be electrically connected to the first connecting electrode 211 through the first through-hole 71, and the second-electrode pad 232 may fill the second through-hole and be electrically connected to the second connecting electrode 231 through the second though-hole 72. The first through-hole 71 has a smaller cross-sectional area than a cross-sectional area of the first-electrode pad 212. The second through-hole 72 has a smaller cross-sectional than the cross-sectional area of the second-electrode pad 232. The first-electrode pad 212 and the second-electrode pad 232 completely fill the first through-hole 71 and the second through-hole 72, respectively, and further extend a certain distance toward the third insulating layer 70 on the periphery of the light-emitting device 1. This structure helps to protect the light-emitting device 1 from moisture entering through the first and second through holes 71, 72 and provides an airtight fit. Referring to FIGS. 22 and 46, in some embodiments, the cross-sectional area of the first through-hole 71 is larger than the cross-sectional area of the first-electrode pad 212, and the cross-sectional area of the second through-hole 72 is larger than a cross-sectional area of the second-electrode pad 232. In this case, it can be understood that a projection of the second-electrode pad 232 on the semiconductor structure 20 is within confines of a projection of the second connecting electrode 231. Similarly, a projection of the first-electrode pad 212 will be within confines of a projection of the first connecting electrode 211. As shown in FIGS. 23 and 24, and FIGS. 47 and 48, the first through-hole 71 has a hole boundary surface surrounding an outer surface of the first-electrode pad 212, a minimum distance (D10) between the hole boundary surface of the first through-hole 71 and the outer surface of the first electrode pad 212 is less than 10 μm and greater than 0 μm. The second through-hole 72 has a hole boundary surface surrounding an outer surface of the second-electrode pad 232, a minimum distance (D11) between the hole boundary surface of the second through-hole 72 and the outer surface of the second-electrode pad 232 is less than 10 μm and greater than 0 μm. In some embodiments, the minimum distance (D10) may be no less than 5 μm and greater than 0 μm, and the minimum distance (D11) may also be no less than 5 μm and greater than 0 μm. These specifications ensure that the first-electrode pad 212 and the second-electrode pad 232 are level with each other, which helps to reduce die bonding solder void ratios in the light-emitting device and increase heat dissipation efficiency.

Referring to FIG. 16, in some embodiments, a minimum distance (D12) between the first-electrode pad 212 and the second-electrode pad 232 is greater than 100 μm and less than 300 μm. The minimum distance (D12) specification between the first-electrode pad 212 and the second-electrode pad 232 is advantageous for achieving high packaging yield of the light-emitting device 1. If the minimum distance (D12) between the first-electrode pad 212 and the second-electrode pad 232 is too small, die bonding may become more difficult due to the increased precision required, which may result in a higher percentage of short circuits in the light-emitting devices 1 thus manufactured. However, by designing the minimum distance (D12) to be as small as feasible without triggering the above mentioned concern, the top surface areas of the first-electrode pad 212 and the second-electrode pad 232 may be maximized which may increase adhesion with the substrate 10 and increase heat dissipation efficiency.

Referring to FIGS. 8, 22, 28 and 46, in some embodiments, a minimum distance (D13) measured along the horizontal direction between the first-electrode pad 212 and a lateral boundary surface of the substrate 10 is greater than 50 μm and no greater than 100 μm. A minimum distance (D13) measured along the horizontal direction from the second-electrode pad 232 to the lateral boundary surface of the substrate 10 is also greater than 50 μm and no greater than 100 μm. When designing the light-emitting device 1, by taking into consideration the minimum distance (D13), an area reserved for a scribe line used in wafer dicing may be minimized. By minimizing the reserved area, the light-emitting area of the light-emitting device may be increased, the first and second electrode pads 212, 232 may have increased top surface areas so that adhesion with the substrate 10 may be increased, and heat dissipation more efficient.

In some embodiments, the third insulating layer 70 has a refractive index greater than 1.4. The third insulating layer 70 may be made of a material such as, but not limited to, silicon dioxide ($SiO_2$), silicon nitride (SiN), aluminum oxide ($Al_2O_3$), etc. In other embodiments, the third insulating layer 70 may be a multilayered film structure composed of high refractive index dielectric film layers alternating with low refractive index dielectric film layers, e.g., a distributed Bragg reflector (DBR). The high refractive index dielectric film layers may be made of titanium dioxide ($TiO_2$), niobium pentoxide ($Nb_2O_5$) tantalum pentoxide ($Ta_2O_5$), hafnium (IV) oxide ($HfO_2$), zirconium dioxide ($ZrO_2$), or other suitable high refractive index materials; the low refractive index dielectric film layers may be made of silicon dioxide ($SiO_2$), magnesium fluoride ($MgF_2$), aluminum pentoxide ($Al_2O_5$), silicon oxynitride ($SiO_xN_y$), or other suitable low refractive index materials. The third insulating layer 70 may have a thickness that is between 500 nm and 1500 nms. The first and second through holes 71, 72 of the third insulating layer 70 has a collective total cross-sectional area that is more than 20% of a total top surface area of the semiconductor structure 20 (or more specifically meaning the top surface area of the first semiconductor layer 21 of the semiconductor structure 20). An interior angle (a9) formed between a side wall and a bottom surface of the third insulating layer 70 is no greater than 50° and greater than 0°. This design ensures that the third insulating layer 70 has superior photoelectric properties.

Figure 25:
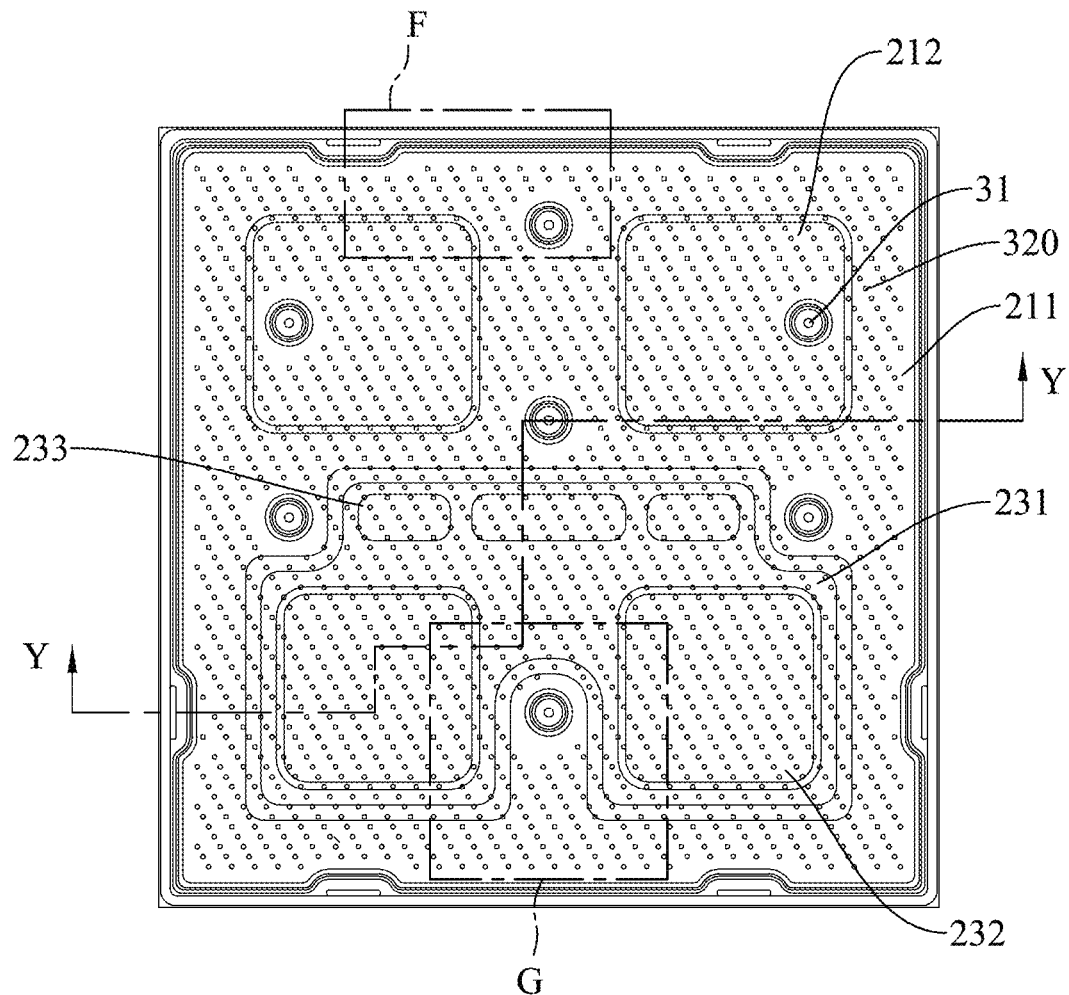
FIG. 25 is a schematic top view illustrating a third embodiment of the light-emitting device according to the present disclosure.

Referring to FIGS. 25 and 28, where a third embodiment of the light-emitting device 1 according to the present disclosure is shown. The third embodiment is generally similar to the second embodiment except for the following differences: the first insulating layer 32 of the insulating layer 30 is formed on top and covers the transparent conductive layer 40, and is formed with a plurality of second through holes 320, each exposing a portion of a top surface of the transparent conductive layer 40. The reflective electrode layer 50 is formed on top of the first insulating layer 32, covers the insulating layer 32 and fills the second through holes 320, and is electrically connected to the transparent conductive layer 40 through the second through holes 320. By having the reflective electrode layer 50 electrically connected to the transparent conductive layer 40 through the second through holes 320, the transparent conductive layer 40 acts to spread and diffuse current that flows through the reflective electrode layer 50. In this embodiment, the reflective electrode layer 50 and the first insulating layer 32 both contribute to forming an omnidirectional reflection which can increase the overall reflectance of light generated in the light-emitting diode 1, and comprehensively improve the photoelectric properties of the light-emitting device 1.

Figure 26:
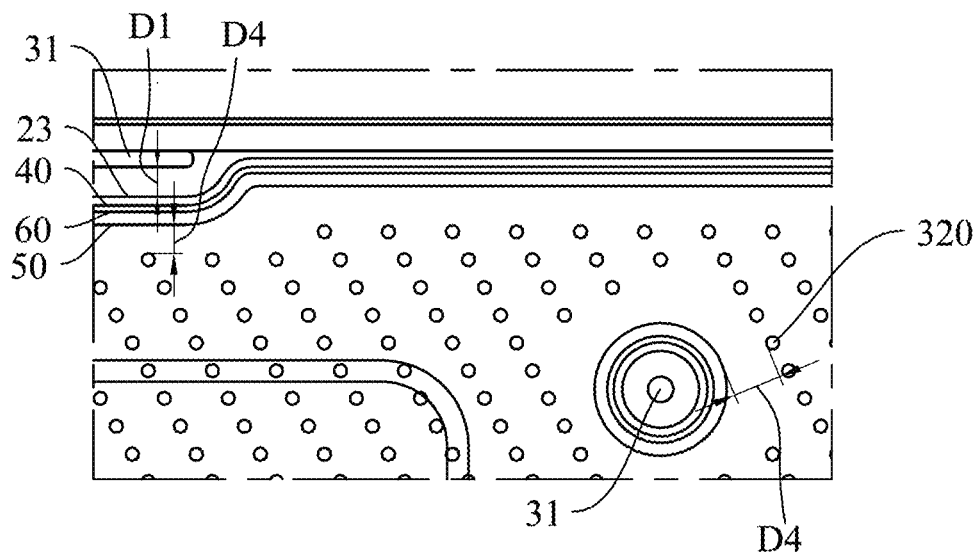
FIG. 26 is an enlarged schematic top view of an F-area shown in FIG. 25, showing the minimum distance D1, and a minimum distance D4.
Figure 27:
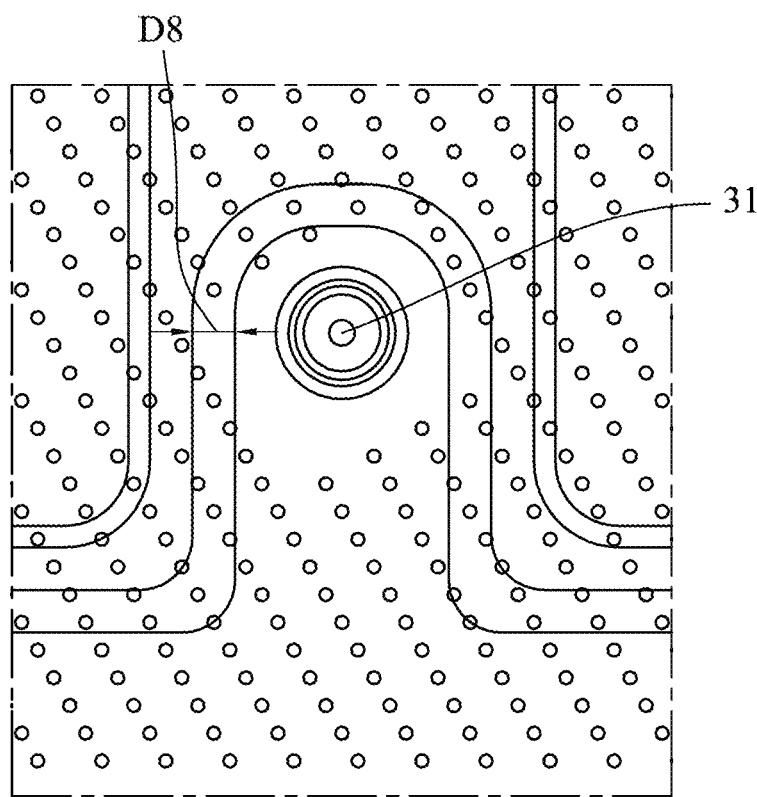
FIG. 27 is an enlarged schematic top view of a G-area shown in FIG. 25, showing the minimum distance D8.

More specifically, the first insulating layer 32 covers the top surface and side walls of the transparent conductive layer 40, the top peripheral area (M1) (see FIG. 8) of the second semiconductor layer 23, and the top peripheral area (M2) (see FIG. 8) of the first semiconductor layer 21 and the side walls (W) (see FIG. 8) of the semiconductor structure 20. In some embodiments, the transparent conductive layer 40 is formed on the top surface of the second semiconductor layer 23 and has a predetermined distance (D2) (see FIG. 31) from the top boundary edge of the second semiconductor layer 23. The electrode coating layer 60 is formed on top of the reflective electrode layer 50, covers the top surface and the side walls of the reflective electrode layer 50, and partially covers the top surface of the first insulating layer 32. More specifically, FIGS. 25 and 26 show the positional relationships between the electrode passage holes 31, the second semiconductor layer 23, the transparent conductive layer 40, the reflective electrode layer 50, and the electrode coating layer 60.

Referring to FIG. 28, in some embodiments, the minimum distance (D2) between an edge of the transparent conductive layer 40 and the top boundary edge of the top surface of the second semiconductor layer 23 is less than a distance (D6) between an edge of the reflective electrode layer 50 and the top boundary edge of the top surface of the second semiconductor layer 23. Referring to FIG. 26, a projection of the reflective electrode layer 50 on the semiconductor structure 20 is within the confines of the transparent conductive layer 40. With this design, the surface contact area between the second semiconductor layer 23 and the transparent conductive layer 40 may be increased, which facilitates the lowering of the operating voltage of the light-emitting device 1.

Figure 31:
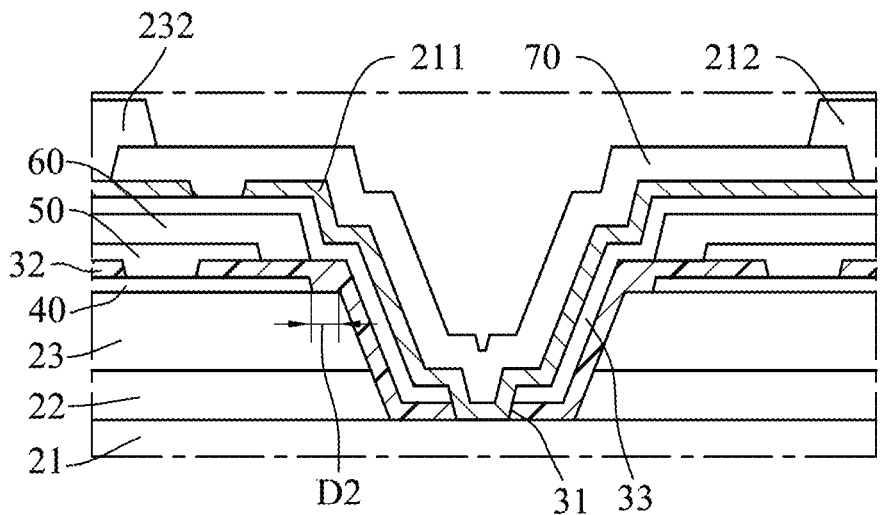
FIG. 31 is an enlarged schematic cross-sectional view of the B'-area shown in FIG. 28, showing the minimum distance D2.

Referring to FIGS. 28 and 31, in some embodiments, the minimum distance (D2) is no less than 2 μm and no greater than 10 μm. For example, the minimum distance (D2) may be no less than 4 μm. Referring to FIG. 31, when the minimum distance (D2) is greater than 2 μm a decent amount of horizontal separation may be reserved between the transparent conductive layer 40 and the mesa recess 9 of the semiconductor structure 20. When the minimum distance (D2) is no greater than 10 μm, the surface area of the transparent conductive layer 40 may be maximized, which increases ohmic contact on the P-type electrode, and decreases operating voltages. Thus, the risk of current leakage and electro-static discharge (ESD) in the light-emitting device 1 may be prevented.

Referring to FIGS. 25 to 28, and 52, 53, and 56, the second through holes 320 may be uniformly distributed at regular separation distances. The separation distances may be the same, may increase according to an arithmetic progression, or increase according to a geometric progression. However, this is not a limitation of the disclosure, and the separation distances may be irregular, or regulated in other ways. The second through holes 320 may be distributed throughout the whole or only over a part of the first insulating layer 32. The second through holes 320 may have many different shapes, including regular shapes such as a circular shape, or a regular polygon shape and irregular shapes such as an irregular polygon shape.

Figure 49:
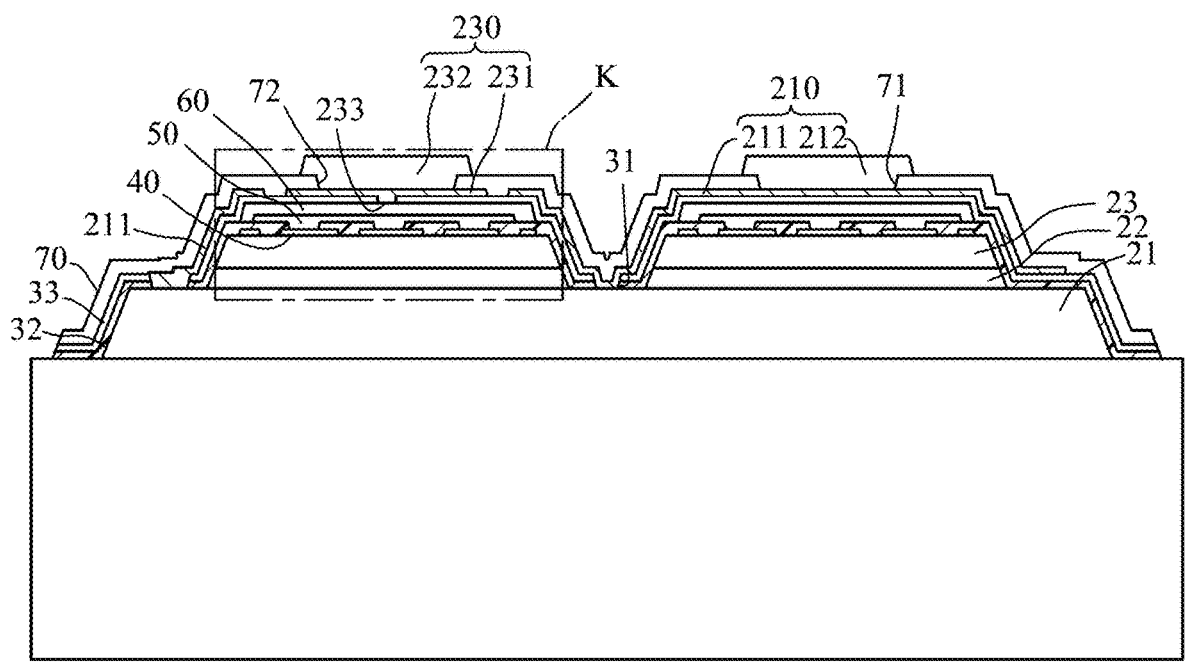
FIG. 49 is a schematic cross-sectional view showing still another variation of the third embodiment of the light-emitting device.
Figure 50:
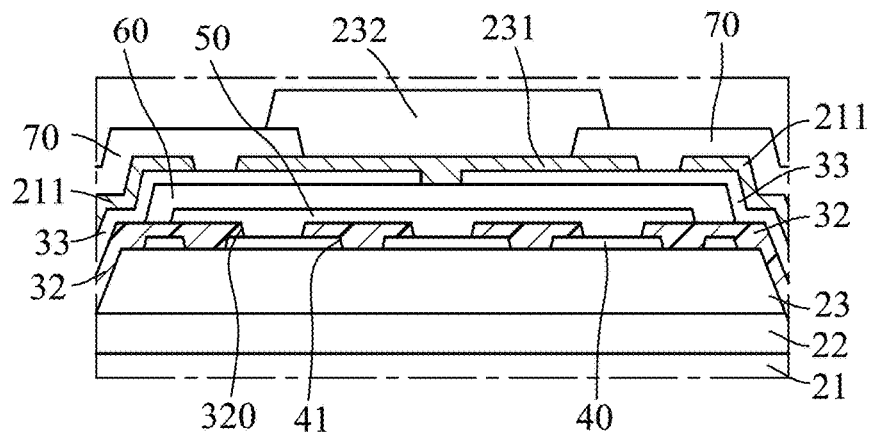
FIG. 50 is an enlarged schematic cross-sectional view of a K-area in FIG. 49.
Figure 51:
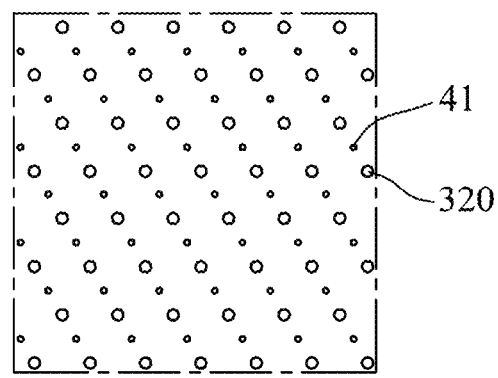
FIG. 51 is a fragmented schematic top view illustrating distribution of first through holes and second through holes of the light-emitting device.

Referring to FIGS. 49 to 51, in some embodiments, the transparent conductive layer 40 is formed with a plurality of first through holes 41, and the first insulating layer 32 contacts the second semiconductor layer 23 through the first through holes 41; likewise the first insulating layer 32 is formed on top of the transparent conductive layer 40, and is formed with a plurality of second through holes 320, each of which exposes a portion of the surface of the transparent conductive layer 40. The first through holes 41 of the transparent conductive layer 41 are not aligned with the second through holes 320 of the first insulating layer 32, meaning that the first through holes 41 are staggered with respect to the second through holes 320 in the stacking direction of the semiconductor structure 20.

The transparent conductive layer 40 may include indium tin oxide (ITO), however this may cause light absorption of the transparent conductive layer 40 to increase. By being formed with the first through holes 41, the light absorption of the transparent conductive layer 40 may be lessened, and the luminous flux of the transparent conductive layer 40 may be increased, while the current spreading effect of the transparent conductive layer 40 remains unhindered. More specifically, the first insulating layer 32 may be a non-opaque insulating layer and form an omnidirectional reflector (ODR) with the reflective electrode layer 50 to enhance reflectance of light generated by the light-emitting device 1. The first insulating layer 32 is also filled into the first through holes 41 so that the light generated in the active layer 22 and reflected by the reflective electrode layer 50 will not be completely absorbed by the transparent conductive layer 40 and thereby improving the overall reflectivity and light emission efficiency in the light-emitting device 1.

Figure 52:
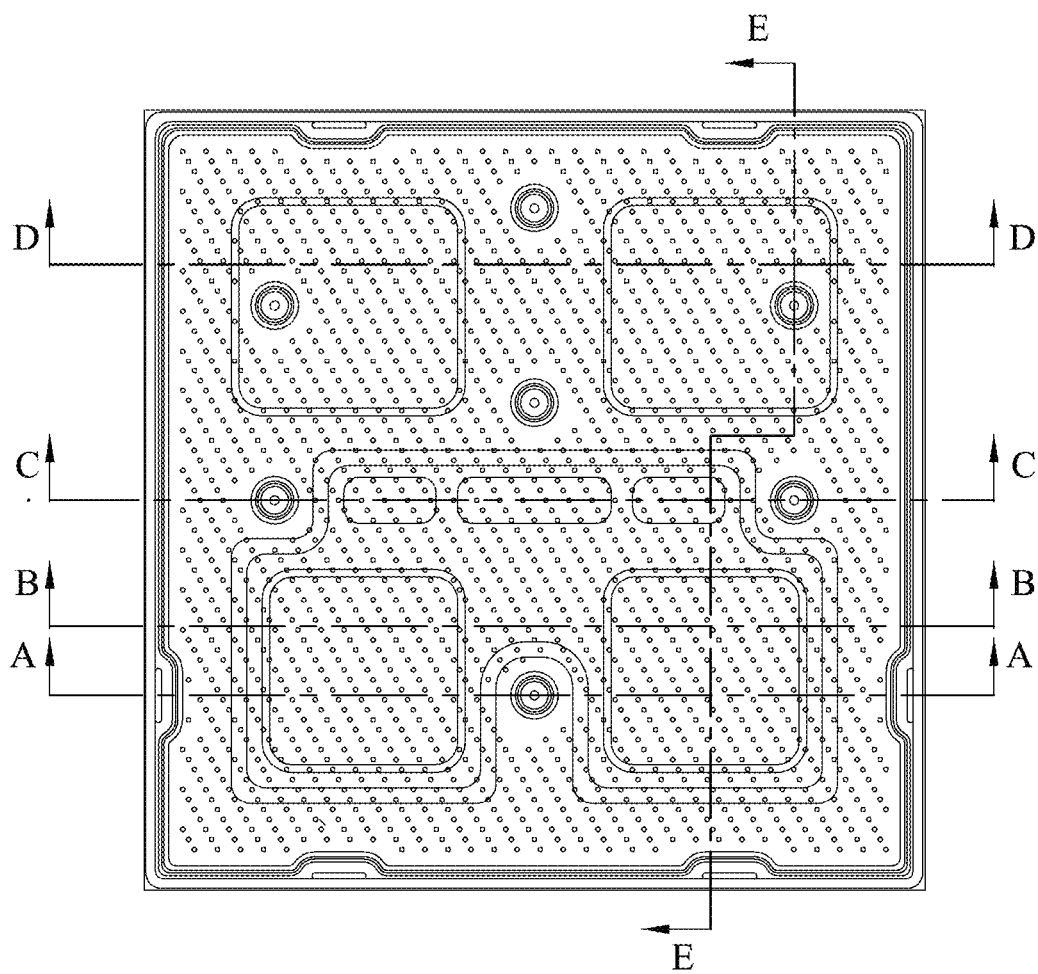
FIG. 52 is a schematic top view of the light-emitting device, showing cross-section lines A to E.
Figure 53:
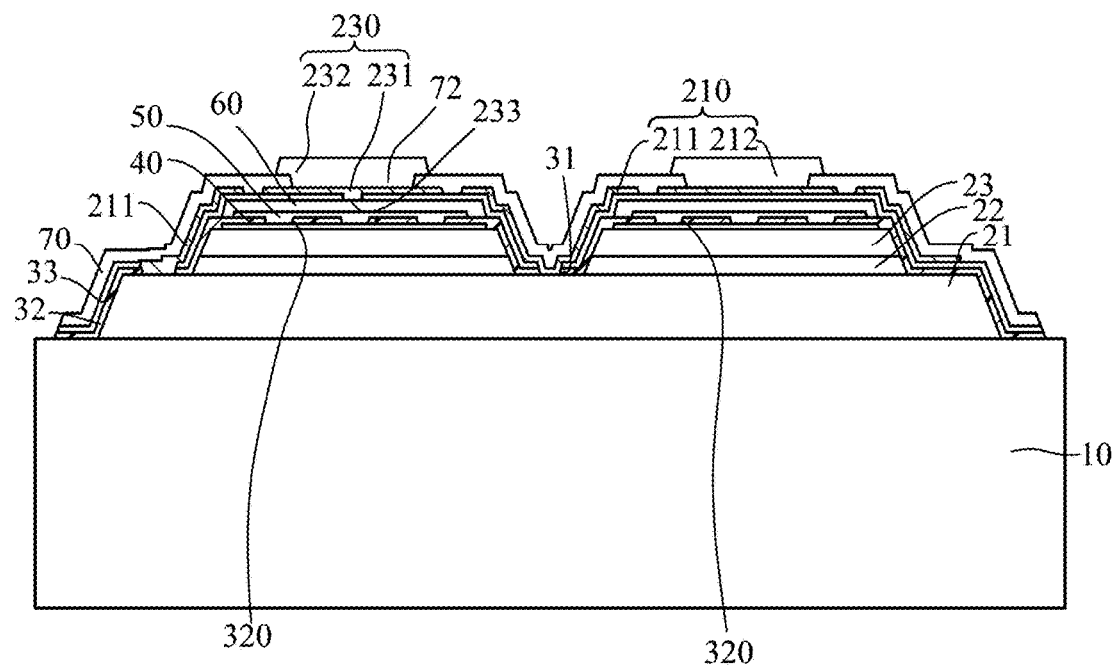
FIGS. 53 to 57 are schematic cross-sectional views of the light-emitting device respectively taken along the lines A to E in FIG. 52.
Figure 54:
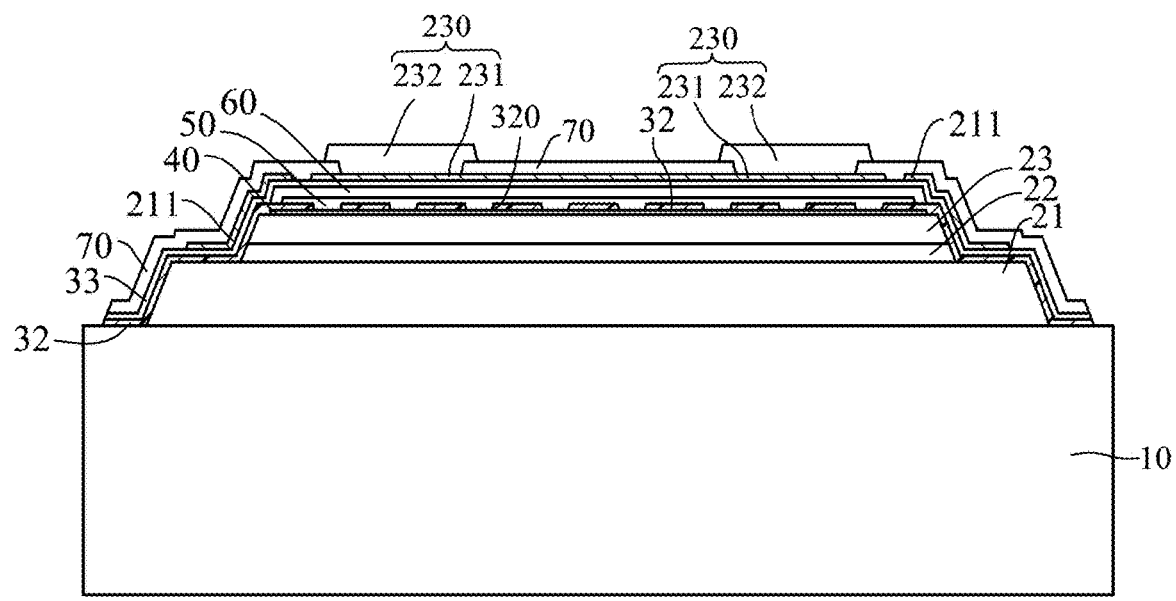
Figure 55:
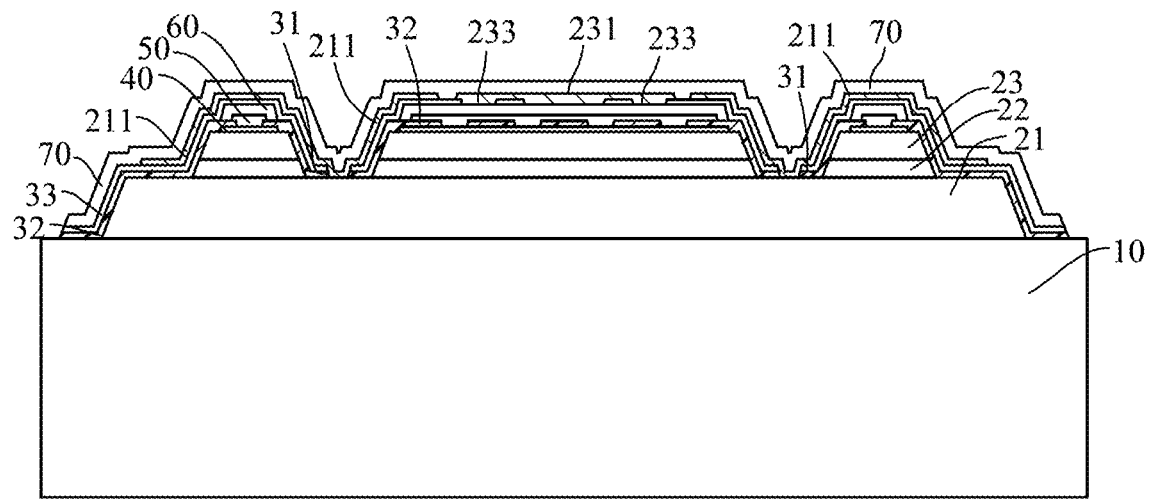
Figure 56:
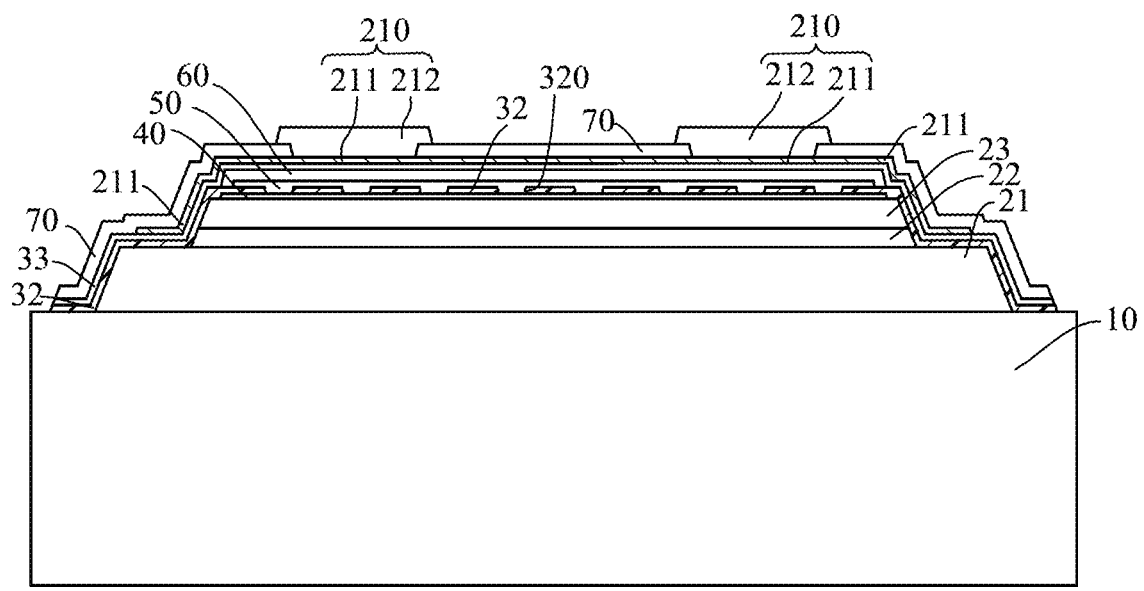
Figure 57:
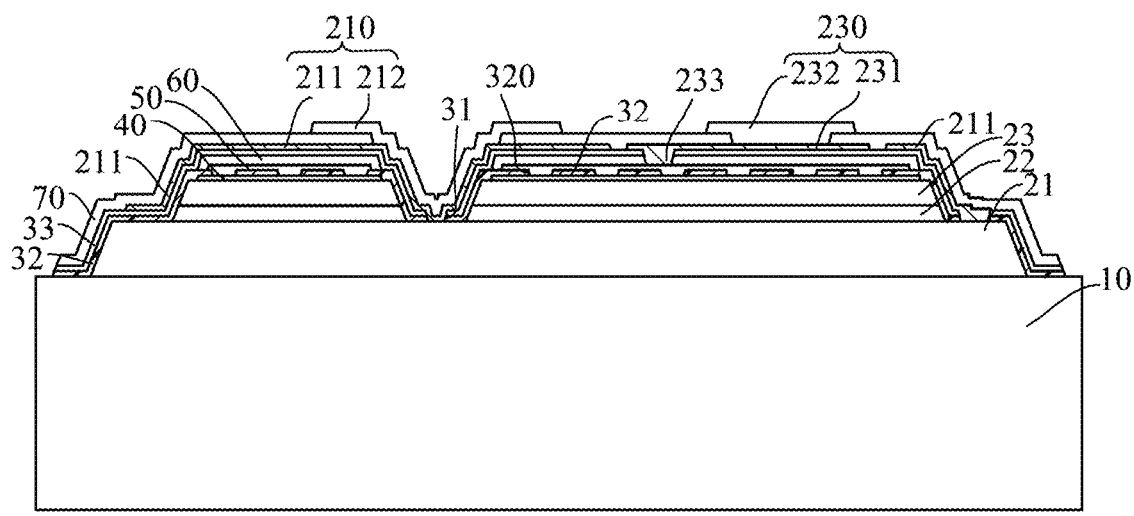

Referring to FIGS. 51 and 52, the first through holes 41 may be uniformly distributed at regular separation distances. The separation distances may be equal, may increase based on an arithmetic progression, a geometric progression, or other types of mathematical progressions and sequences. In some embodiments, the separation distances may be designed for particular usage scenarios or practical requirements and may be irregular, or based on some other regulated sequence. The first through holes 41 may be distributed throughout the whole or only over a part of the transparent conductive layer 40. The first through holes 41 may be in many different shapes including regular shapes such as a circular shape, or a regular polygon shape and irregular shapes such as irregular polygon shapes. It should be noted, that the second through holes 320 may be designed with the same separation distance as the first through holes 41 or use a different separation distance.

In some embodiments, the first through holes 41 have a diameter greater than 2 μm. In preferred embodiments, a total cross-sectional area of the first through holes 41 collectively is from 0.2% to 20% of the total top surface area of the semiconductor structure 20. It should be noted, that the total cross-sectional area of the first through holes 41 affects the drive current density of the light-emitting device 1 and should be adjusted accordingly during the design phase before beginning mass production.

In some embodiments, the second through holes 320 have a diameter that is greater than 2 μm. In preferred embodiments, a total cross-sectional area of the second through holes 320 collectively is from 0.2% to 20% of the total top surface area of the semiconductor structure 20.

Referring to FIG. 51, in some embodiments, each of the second through holes 320 has a cross-sectional area larger than that of each of the first through holes 41 so that a satisfactory compromise between the drive voltage and the brightness output of the light-emitting device 1 may be reached. In some embodiments, each bottom surface of the first through holes 41 has a cross-sectional area smaller than that of each bottom surface of the second through holes 320. With this design, the light-emitting device 1 may have low voltage, high light emission efficiency and low power use.

It should be noted, that the light absorbing qualities of the transparent conductive layer 40 will affect the brightness output of the light-emitting device 1, and therefore the transparent conductive layer 40 should be made as thin as possible to decrease light absorption. However, when the transparent conductive layer 40 is made thinner, the drive voltage of the light-emitting device 1 will regrettably increase. Therefore, a good compromise between drive voltage and brightness output may be reached when the transparent conductive layer 40 has a thickness that is between 5 nm and 150 nm. For example, in some embodiments, the transparent conductive layer 40 may have a thickness that is between 15 nm and 30 nm, and in other embodiments, the thickness of the transparent conductive layer 40 may be between 4 nm and 5 nm. A point should be made, however, that the first insulating layer 32 of the present disclosure has the property of increasing brightness in addition to providing insulation to the light-emitting device 1. Therefore, the first insulating layer 32 should have a thickness that is between 300 nm and 1500 nm. Within these specifications the first insulating layer 32 improves light emission efficiency and increases the brightness of the light-emitting device 1. In some embodiments, the thickness of the first insulating layer 32 may be no less than 400 nm.

Figure 24:
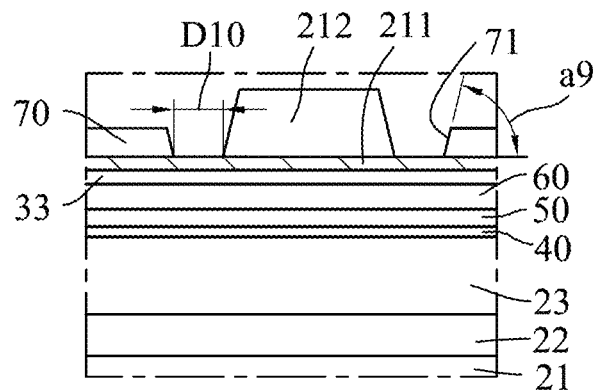
FIG. 24 is the enlarged schematic cross-sectional view of a J'-area shown in FIG. 22, showing a minimum distance D10.
Figure 34:
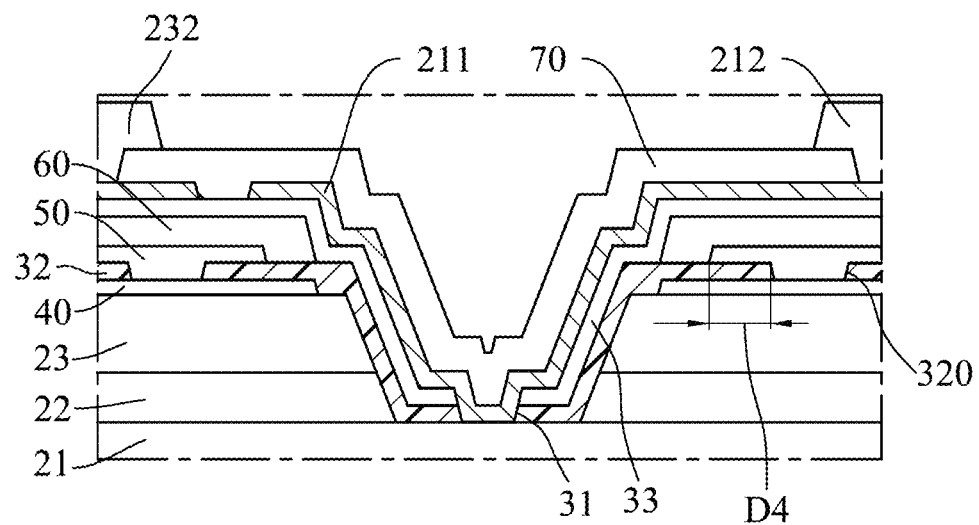
FIG. 34 is an enlarged schematic cross-sectional view of the B'-area shown in FIG. 28, showing the minimum distance D4.
Figure 35:
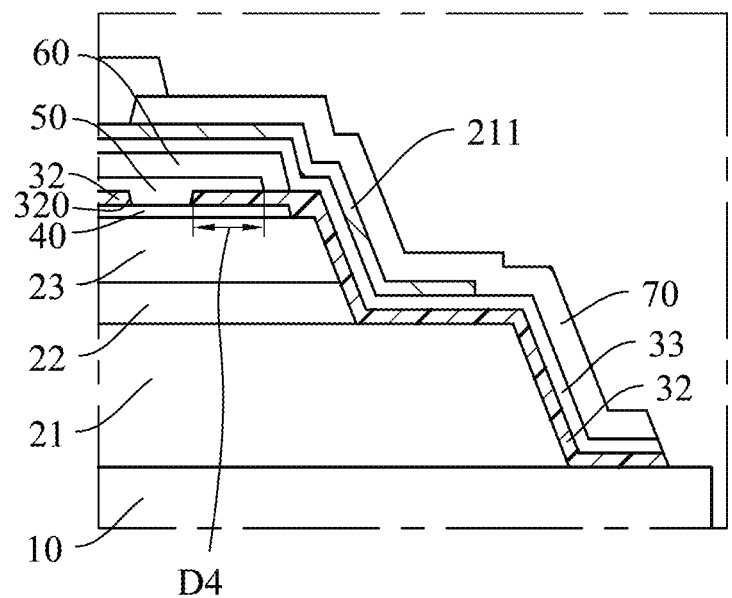
FIG. 35 is an enlarged schematic cross-sectional view of a C'-area shown in FIG. 28, showing the minimum distance D4.

Referring to FIGS. 24 and 25, the first insulating layer 32 is formed with a plurality of second through holes 320. Referring to FIG. 34, a predetermined minimum distance (D4) is provided between a left end of a bottom of the reflective electrode layer 50 below the first electrode 210 and a top boundary edge of a nearest second through hole 320. Referring to FIG. 35, the minimum distance (D4) is also provided between a right end of the bottom of the reflective electrode layer 50 below the first electrode 210 and a top boundary edge of the nearest second through hole 320.

The minimum distance (D4) is preferably no less than 5 μm and no greater than 50 μm. In the microfabrication process of the light-emitting device 1, a wet-etching process such as a buffered oxide etch (BOE) is generally used to form the second through hole 320 in the first insulating layer 32. The buffered oxide etch (BOE) is an isotropic wet-etching technique that will etch into the lateral surface of the first insulating layer 32, resulting in an expansion of the second through hole 320. When the reflective electrode layer 50 is formed via sputter deposition, the reflective electrode layer 50 thus formed will also be expanded (when compared to the original design specifications of the light-emitting device 1). Additionally, the second through hole 320 and the reflective electrode layer 50 may experience positional deviation during exposure in the photolithographic process. Therefore, when the minimum distance (D4) is too small, the marginal edge of the reflective electrode layer 50 may overlap with a boundary of the second through hole 320 (i.e., the marginal edge of the reflective electrode layer 50 may cover the second through hole 320 or fill the second through hole 320). When such an overlap develops, resist stripping will be more difficult and residues of the photoresist may remain after stripping. This may cause abnormalities in the subsequently formed metal coating layer and insulation layer which may cause leakage or electrostatic discharge (ESD) in the fabricated light-emitting device 1.

In some embodiments, the minimum distance (D4) may be greater than 10 μm. In some embodiments, the minimum distance (D4) may be no less than 15 μm so that no overlap may develop between the marginal edge of the reflective electrode layer 50 and the boundary of the second through hole 320, and thereby prevent the previously mentioned problems of leakage and electrostatic discharge (ESD).

Figure 36:
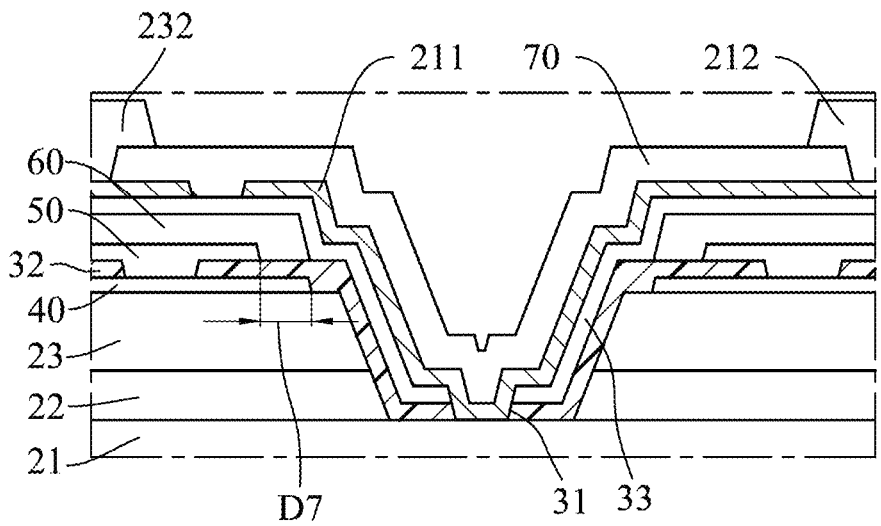
FIG. 36 is an enlarged schematic cross-sectional view of the B'-area shown in FIG. 28, showing a minimum distance D7.
Figure 37:
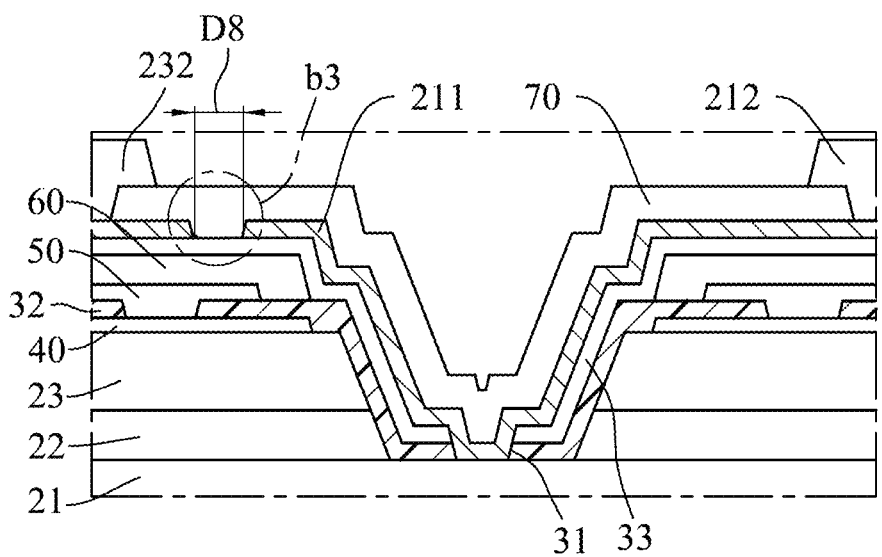
FIG. 37 is an enlarged schematic cross-sectional view of the B'-area shown in FIG. 28, showing the minimum distance D8.
Figure 38:
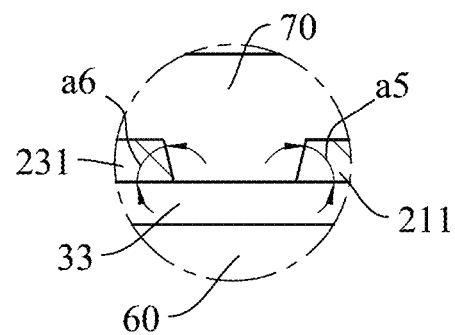
FIG. 38 is an enlarged schematic cross-sectional view of a b3-area in FIG. 37, showing an angle a6 and an angle a5.

Referring to FIGS. 28 and 36, a predetermined minimum distance (D7) is provided between the edge of the bottom surface of the reflective electrode layer 50 and the edge of the bottom surface of the transparent conductive layer 40.

The minimum distance (D7) is no less than 2 μm and no greater than 9 μm, and the transparent conductive layer 40 has a bottom surface area that is larger than a bottom surface area of the reflective electrode layer 50. This design maximizes the surface area of the reflective electrode layer 50 while ensuring that the reflective electrode layer 50 is protected by the electrode coating layer 60 so that light emission efficiency may be improved and chip brightness increased. In some embodiments, the bottom surface area of the reflective electrode layer 50 is preferably greater than 80% of the top surface area of the semiconductor structure 20. When the first semiconductor layer 21 is etched, it is more favorable that the area etched away is less than 10% of the total top surface area of the semiconductor structure 20. Therefore, through the precision control of the fabrication process of the light-emitting device 1, the surface area of the reflective electrode layer 50 may be maximized and the brightness of the light-emitting device 1 enhanced.

Figure 29:
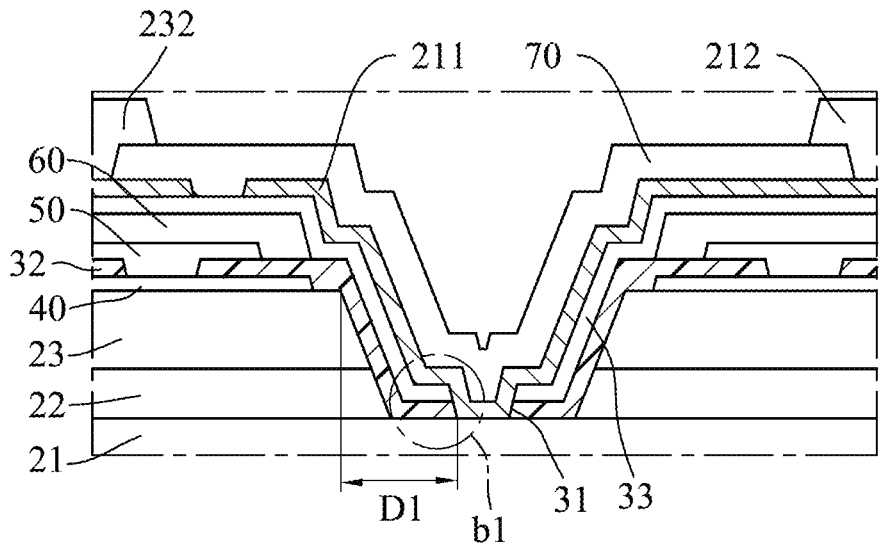
FIG. 29 is an enlarged schematic cross-sectional view of a B'-area shown in FIG. 28, showing the minimum distance D1.
Figure 30:
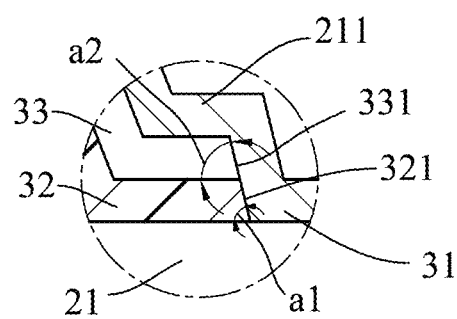
FIG. 30 is an enlarged schematic cross-sectional view of a b1-area shown in FIG. 29, showing an angle a1, and an angle a2.

Referring to FIGS. 28 and 29, the minimum distance (D1) is also provided between an edge of a bottom surface of the first connecting electrode 211 and the top boundary edge of the top surface of the second semiconductor layer 23.

Figure 39:
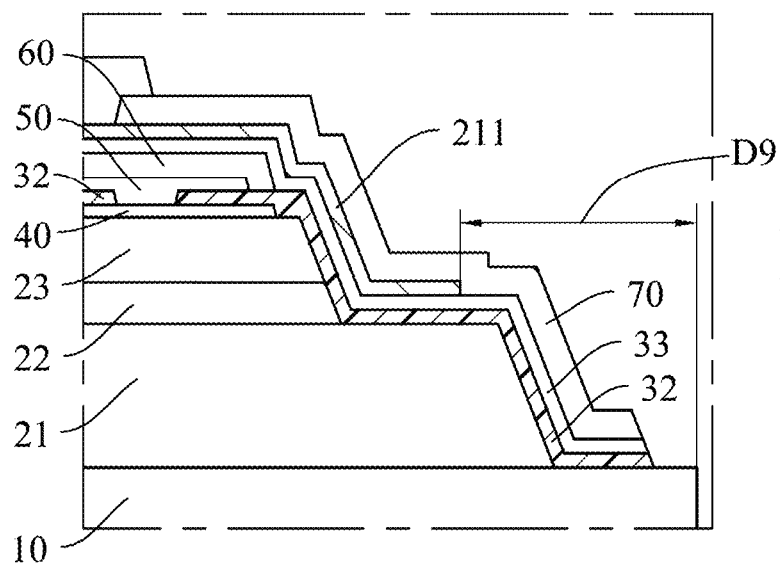
FIG. 39 is an enlarged schematic cross-sectional view of the C'-area shown in in FIG. 28, showing a minimum distance D9.
Figure 40:
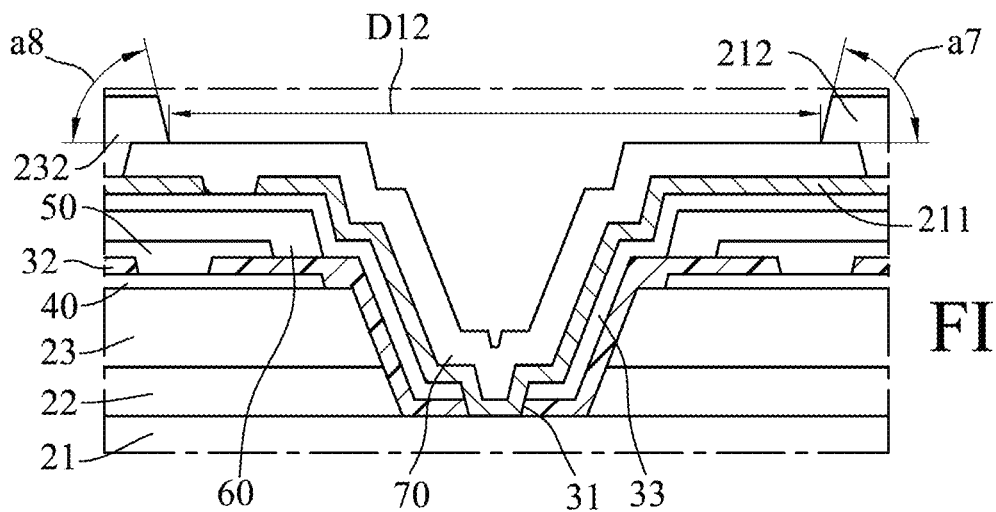
FIG. 40 is an enlarged schematic cross-sectional view of the B'-area shown in FIG. 28, showing an angle a7, an angle a8, and the minimum distance D12.
Figure 41:
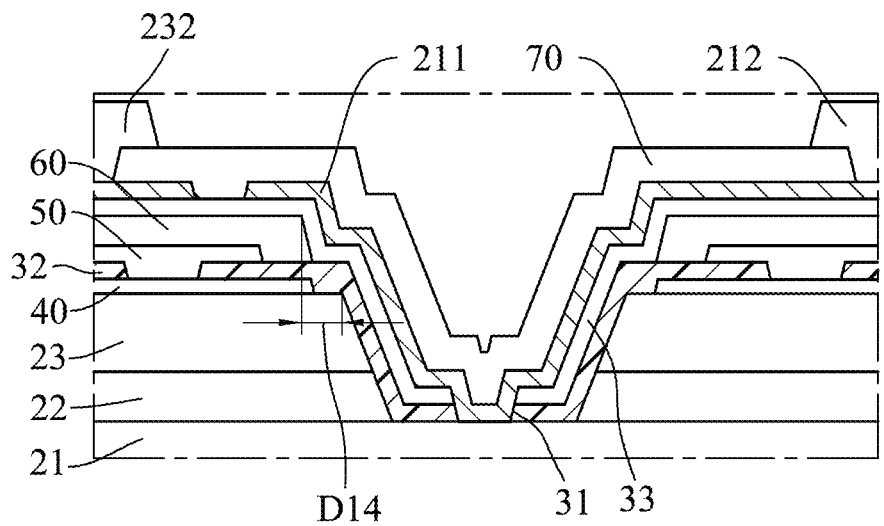
FIG. 41 is an enlarged schematic cross-sectional view of the B'-area shown in FIG. 28, showing the minimum distance D14.

Referring to FIGS. 28 and 39, a minimum distance (D9) between an edge of the bottom surface of the first connecting electrode 211 and the lateral boundary surface of the substrate 10 is no less than 10 μm and no greater than 50 μm. Such a design possesses various advantages such as maximizing the surface area of the electrode pads, increasing the adhesion between the electrode pads and the substrate 10, enhancing the heat dissipation of the light-emitting device 1, and thereby improve the overall photoelectric characteristic of the light-emitting device 1.

The electrode pads (the first-electrode pad 212, and the second-electrode pad 232) may include a material such as titanium (Ti), aluminum (Al), nickel (Ni), platinum (Pt), or gold (Au). Generally, top surfaces of the electrode pads include gold (Au) to facilitate packaging of the light-emitting device 1. In some embodiments, a solder-material layer may cover the electrode pads (the first-electrode pad 212, and the second-electrode pad 232). The solder-material layer may include tin (Sn). For example, the solder-material layer may be a tin-silver-copper (Sn—Ag—Cu) alloy or a tin antimony (Sn—Sb) alloy. The solder-material layer has a melting point that is between 200° C. to 250° C. The solder-material layer may have a thickness that is between 60 μm and 100 μm to ensure the light-emitting device 1 has enough material for a packaging end for soldering. In some embodiment, the thickness of the solder-material layer is 80±10 μm. The solder-material layer may prevent leakage and facilitate die-bonding and packaging of the light-emitting device 1.

Figure 58:
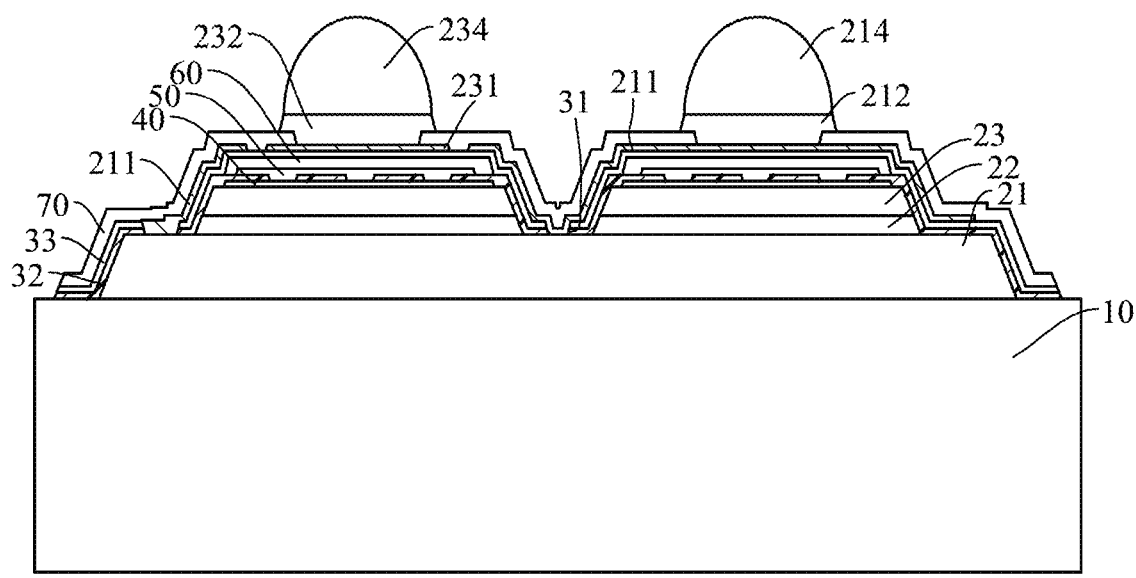
FIGS. 58 and 59 are schematic cross-sectional views of different embodiments of solder-material layers of the present invention.

Referring to FIG. 58, the solder-material layer is disposed above the electrode pads. More specifically, the first-electrode pad 212, and the second-electrode pad 232 respectively have a first solder-material layer 214 and a second solder-material layer 234 disposed above. The first solder-material layer 214 and the second solder-material layer 234 respectively extend from the first-electrode pad 212 and the second-electrode pad 232 in a convex protrusion. The first and second solder-material layers 214, 234 have flat bottom surfaces and domed top surfaces.

Figure 59:
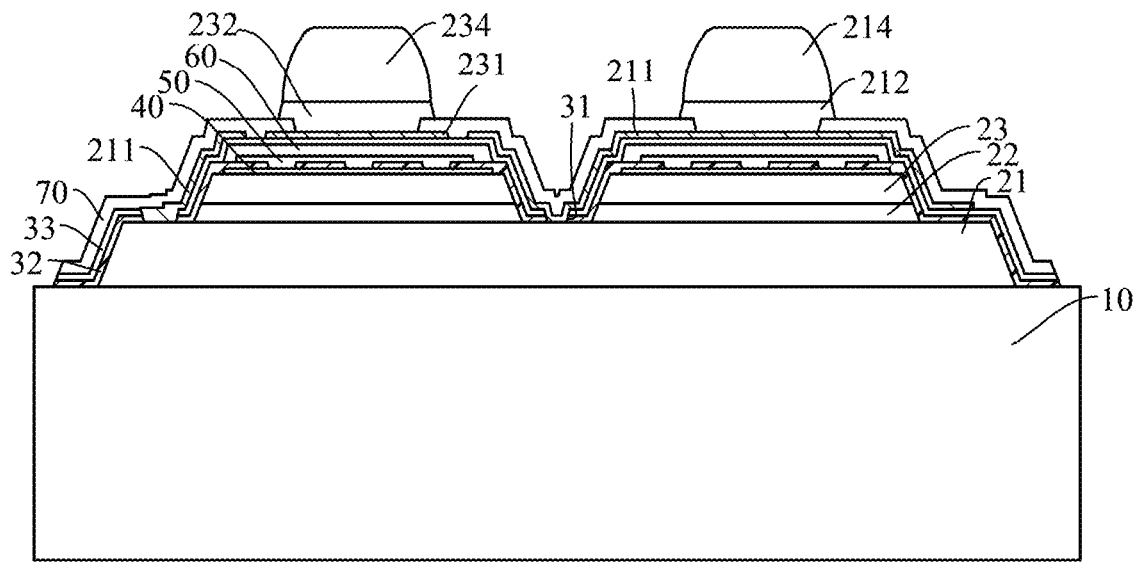

However, in some embodiments, the first and second solder-material layer 214, 234 have flat tops (as shown in FIG. 59) to facilitate demolding, decrease solder void ratios, and facilitate the die-bonding and packaging of the light-emitting device 1.

A light emitting module using the light-emitting device 1 of any of the embodiments and variations that have been described is also a part of the present disclosure. The light emitting module using the light-emitting device 1 has superior photoelectric properties.

In summary, the light-emitting device 1 and the light-emitting module using the light-emitting device of the present disclosure is an improvement over the state of the art, and has superior photoelectric properties.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A light emitting diode (LED) device comprising:
a semiconductor structure having a first semiconductor layer, an active layer, and a second semiconductor layer that are stacked sequentially,
said semiconductor structure having at least one mesa recess that is formed with a mesa recess boundary wall, that extends from a top surface of said second semiconductor layer to a top surface of said first semiconductor layer to expose said top surface of said first semiconductor layer at a bottom of said mesa recess, and that is located at an inside region of said semiconductor structure, and/or a border region of said semiconductor structure,
an insulating layer covering at least side walls of said semiconductor structure in said border region, said mesa recess boundary wall, and a portion of said top surface of said first semiconductor layer at said bottom of said mesa recess, and having at least one electrode passage hole formed on said top surface of said first semiconductor layer at said bottom of said mesa recess;
a transparent conductive layer formed in contact with said top surface of said second semiconductor layer; and
a reflective electrode layer formed on a top side of said transparent conductive layer,
wherein said at least one electrode passage hole has a bottom end that meets said top surface of said first semiconductor layer at said bottom of said mesa recess, said top surface of said second semiconductor layer having a top boundary edge intersecting said mesa recess boundary wall above said at least one electrode passage hole, a minimum distance measured along a horizontal direction perpendicular to a stacking direction of said semiconductor structure from said bottom end of said at least one electrode passage hole to said top boundary edge of said second semiconductor layer is no less than 1 µm, wherein said reflective electrode layer has a peripheral portion that extending downward from said top side of said transparent conductive layer, surrounding said reflective conductive layer, and contacting said top surface of said second semiconductor layer, said reflective electrode layer including at least one silver (Ag) reflective layer, and wherein adhesion between said at least one silver (Ag) reflective layer of said reflective electrode layer and said second semiconductor layer is higher than adhesion between said transparent conductive layer and said second semiconductor layer.

2. The LED device as claimed in claim 1, wherein said at least one electrode passage hole is a through hole with a diameter greater than 8 µm.

3. The LED device as claimed in claim 1, wherein said insulating layer on said mesa recess boundary wall has a raised film platform that covers and contacts said portion of said top surface of the first semiconductor layer at the bottom of the mesa recess, and said raised film platform bounds said electrode passage hole.

4. The LED device as claimed in claim 1, wherein said insulating layer includes a first insulating layer covering said semiconductor structure, and a second insulating layer that is stacked on top of said second semiconductor layer, said first insulating layer at least covering said side walls of said semiconductor structure in said border region and said mesa recess boundary wall; and said LED device further comprising:

a third insulating layer located above said second insulating layer and at least covering said second insulating layer and/or said reflective electrode layer;
a first connecting electrode;
a first-electrode pad; and
a second-electrode pad, said first-electrode pad and said second-electrode pad being located above said third insulating layer, and partially extending through said third insulating layer, said first connecting electrode being disposed between said second insulating layer and said third insulating layer, and electrically connected to said first-electrode pad, said second-electrode pad being electrically connectable to said reflective electrode layer;
wherein said electrode passage hole passes through said first insulating layer and said second insulating layer, and said first connecting electrode being electrically connected to said first semiconductor layer through said electrode passage hole.

5. The LED device as claimed in claim 4, wherein a total thickness of said first insulating layer and said second insulating layer on said side walls of said semiconductor structure is no less than 800 nm.

6. The LED device as claimed in claim 4, wherein said electrode passage hole has an inclined electrode hole boundary surface that is inclined with said top surface of said first semiconductor layer at an angle of no greater than 50°.

7. The LED device as claimed in claim 4, further comprising a second connecting electrode disposed between said third insulating layer and said second insulating layer, having one end that is electrically connected to said second-electrode pad, and another end that is distal to said second-electrode pad, that extends through said second insulating layer and that is electrically connectable to said reflective electrode layer.

8. The LED device as claimed in claim 7, wherein a minimum distance between said first connecting electrode and said second connecting electrode is no less than 10 µm and no greater than 50 µm.

9. The LED device as claimed in claim 7, wherein a projection of said second-electrode pad onto said semiconductor structure is within confines of a projection of said second connecting electrode.

10. The LED device as claimed in claim 7, wherein:
said third insulating layer has a first through-hole and a second through-hole;
said first-electrode pad is electrically connected to said first connecting electrode through said first through-hole, and said second-electrode pad being electrically connected to said second connecting electrode through said second through-hole; and
a cross-sectional area of said first through-hole is larger than a cross-sectional area of said first-electrode pad, and a cross-sectional area of said second through-hole is larger than a cross-sectional area of said second-electrode pad.

11. The LED device as claimed in claim 10, wherein:
said first through-hole has a hole boundary surface surrounding an outer surface of said first-electrode pad, a minimum distance between said hole boundary surface of said first through-hole and said outer surface of said first-electrode pad being less than 10 µm; and
said second through-hole has a hole boundary surface surrounding an outer surface of said second-electrode pad, a minimum distance between said hole boundary surface of said second through-hole and said outer surface of said second-electrode pad being less than 10 µm.

12. The LED device as claimed in claim 4, further comprising a substrate, said semiconductor structure being formed on said substrate, a minimum distance measured along the horizontal direction between said first-electrode pad and a lateral boundary surface of said substrate being greater than 50 µm, and a minimum distance measured along a horizontal direction from said second-electrode pad to said lateral boundary surface is greater than 50 µm.

13. The LED device as claimed in claim 4, wherein:
said reflective electrode layer covers said transparent conductive layer; and
a minimum distance between an edge of a bottom surface of said reflective electrode layer and said top boundary edge of said top surface of said second semiconductor layer is less than a distance between an edge of a bottom surface of said transparent conductive layer and said top boundary edge of said top surface of second semiconductor layer.

14. The LED device as claimed in claim 4, further comprising an electrode coating layer disposed on said reflective electrode layer.

15. The LED device as claimed in claim 4, wherein said minimum distance measured along the horizontal direction from a boundary of a contact area between said first connecting electrode and said first semiconductor layer to said top boundary edge of said top surface of said second semiconductor layer is greater than 2 µm.

16. A light emitting module as claimed using the LED device in claim 1.

* * * * *